(12) United States Patent
Gurary et al.

(10) Patent No.: US 12,104,242 B2
(45) Date of Patent: Oct. 1, 2024

(54) DEPOSITION SYSTEM WITH INTEGRATED CARRIER CLEANING MODULES

(71) Applicant: Veeco Instruments Inc., Plainview, NY (US)

(72) Inventors: Alexander I. Gurary, Bridgewater, NJ (US); Mandar Deshpande, Bridgewater, NJ (US); Ajit Paranjpe, Basking Ridge, NJ (US)

(73) Assignee: VEECO INSTRUMENTS INC., Plainview, NY (US)

( * ) Notice: Subject to any disclaimer, the term of this patent is extended or adjusted under 35 U.S.C. 154(b) by 751 days.

(21) Appl. No.: 16/870,110

(22) Filed: May 8, 2020

(65) Prior Publication Data

US 2020/0354828 A1 Nov. 12, 2020

Related U.S. Application Data

(60) Provisional application No. 62/846,417, filed on May 10, 2019.

(51) Int. Cl.
| | |
|---|---|
| *C23C 16/44* | (2006.01) |
| *C23C 16/02* | (2006.01) |
| *C23C 16/46* | (2006.01) |
| *C23C 16/54* | (2006.01) |
| *H01J 37/32* | (2006.01) |
| *H05B 1/02* | (2006.01) |

(52) U.S. Cl.
CPC ...... *C23C 16/0227* (2013.01); *C23C 16/4412* (2013.01); *C23C 16/463* (2013.01); *C23C 16/54* (2013.01); *H01J 37/32899* (2013.01); *H05B 1/0233* (2013.01)

(58) Field of Classification Search
None
See application file for complete search history.

(56) References Cited

U.S. PATENT DOCUMENTS

| 5,217,501 A | * | 6/1993 | Fuse | H01L 21/67757 29/25.01 |
|---|---|---|---|---|
| 2004/0182472 A1 | * | 9/2004 | Aggarwal | H01L 21/67393 141/98 |
| 2009/0199968 A1 | * | 8/2009 | Brody | B08B 13/00 118/729 |
| 2012/0247671 A1 | * | 10/2012 | Sugawara | H01J 37/32642 156/345.31 |
| 2012/0307233 A1 | * | 12/2012 | Boguslavskiy | H01L 21/67109 356/43 |
| 2017/0067163 A1 | * | 3/2017 | Papasouliotis | H01L 21/02529 |

* cited by examiner

*Primary Examiner* — Karla A Moore
(74) *Attorney, Agent, or Firm* — Leason Ellis LLP

(57) ABSTRACT

A chemical vapor deposition system for semiconductor wafer production is disclosed. The system includes a process cluster coupled to a first end of a transfer chamber. The process cluster is maintained at a pressure that is lower than atmospheric pressure. The process cluster is also configured to apply epitaxial layers on one or more wafers loaded onto a wafer carrier. The system also includes an automatic factory interface coupled to a second end of the transfer chamber. The automatic factory interface is maintained at atmospheric pressure. The system includes one or more wafer carrier cleaning modules coupled to the automatic factory interface and configured to clean one or more of the wafer carriers without removing the wafer carriers from the chemical vapor deposition system.

12 Claims, 16 Drawing Sheets

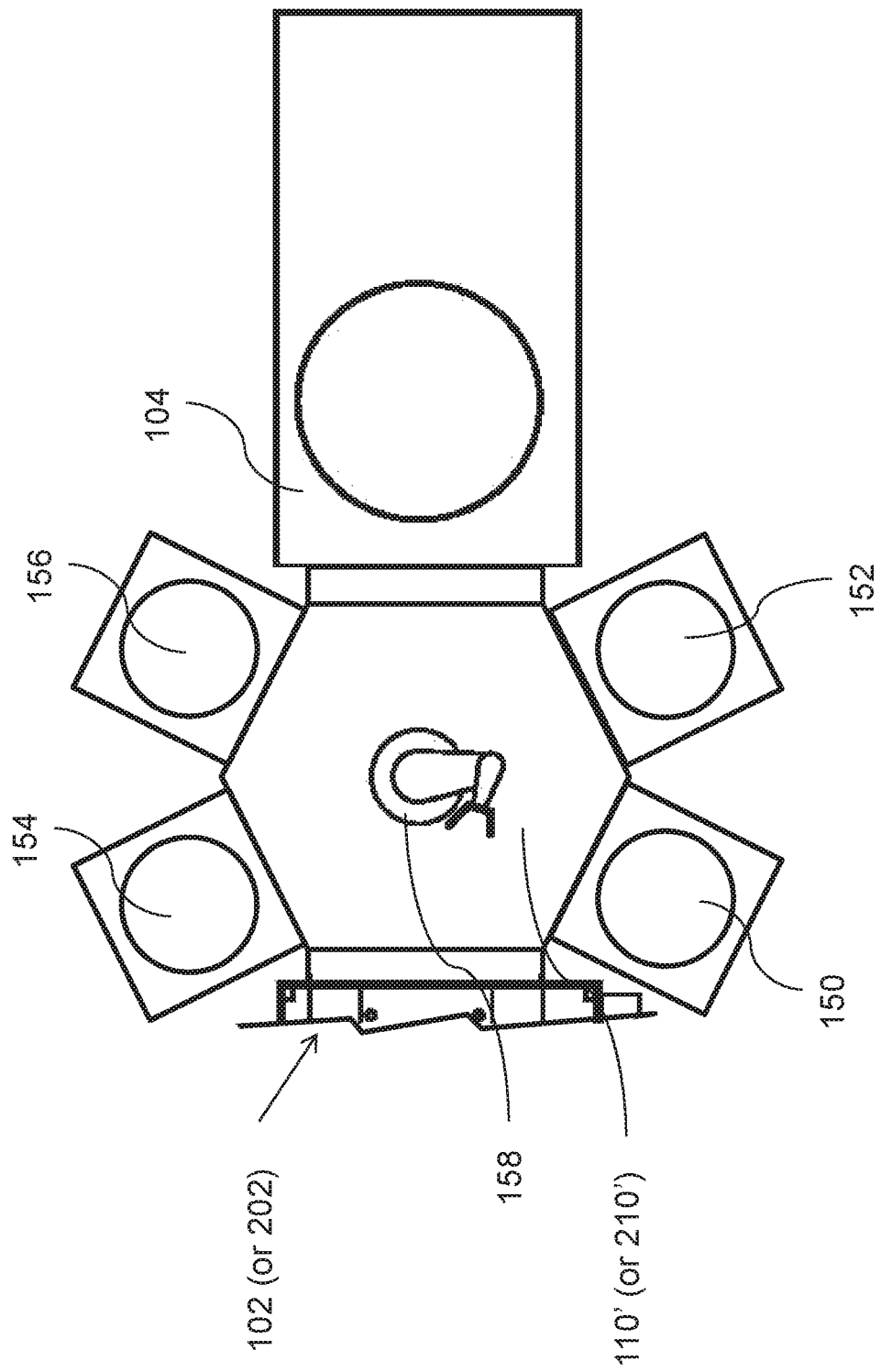

DEPOSITION SYSTEM WITH INTEGRATED CARRIER CLEANING MODULES

RELATED APPLICATION

This application claims the benefit of U.S. Provisional Application No. 62/846,417 filed May 10, 2019, which is hereby fully incorporated herein by reference.

TECHNICAL FIELD

The present invention relates to semiconductor wafer production, and more particularly, semiconductor wafer carrier cleaning.

BACKGROUND

Certain processes for fabrication of semiconductors can require a complex process for growing epitaxial layers to create multilayer semiconductor structures for use in fabrication of high performance devices, such as light emitting diodes, laser diodes, optical detectors, power electronics, and field effect transistors. In this process, the epitaxial layers are grown through a general process called Chemical Vapor Deposition (CVD). One type of CVD process is called Metal Organic Chemical Vapor Deposition (MOCVD). In MOCVD, a reactor gas is introduced into a sealed reactor chamber within a controlled environment that enables the reactor gas to be deposited on a substrate (commonly referred to as a wafer) to grow thin epitaxial layers.

In multi-layered semiconductor fabrication using MOCVD, processing time increases significantly because the wafers need to be removed from each reaction chamber and placed into a different reaction chamber when a different epitaxial layer is grown. The processing time increases during this transition due to reactor chamber ramp up, ramp down, and transportation time.

An improvement in the industry is described in U.S. Patent Publication No 2017/0067163 A1, the contents of which are hereby incorporated herein by reference. U.S. Patent Publication No 2017/0067163 A1 discloses a plurality of reactors that are coupled to a common processing cluster.

Epitaxial deposition processes of semiconductor wafer production, such as MOCVD, also requires wafer carrier cleaning at various stages in processing as is discussed in, for example, U.S. Pat. Nos. 8,021,487 B2 and 8,958,061 B2, the contents of both are hereby incorporated herein by reference In conventional systems, for example, cleaning may be conducted after each deposition run in a CVD reactor. For example, wafer carrier cleaning is required after each deposition run of group (III) semiconductor wafer production, such as Gallium Nitride (hereinafter "GaN"), Aluminum Nitride (hereinafter "AlN"), Indium Nitride (hereinafter "InN"), etc.

Pre-cleaning of wafers can also be performed in order to ensure proper crystal growth by removing oxides or contaminants from the surfaces of a wafer carrier that will be positioned in a CVD reactor. Pre-cleaning must typically be conducted immediately before the wafer carrier is placed into the reactor, because exposure of the cleaned surface to additional contaminants or sources of oxygen can reverse the benefit of the cleaning over time.

Conventionally, wafer carrier cleaning processes require that the carrier be removed from the system. Once removed, the wafer carrier may be cleaned using thermal baking or thermally activated reactants, such as hydrogen chloride (hereinafter "HCl"), chlorine gas (hereinafter "$Cl_2$"), hydrogen gas (hereinafter "$H_2$"), etc. Alternatively, wafer carrier cleaning can be accomplished outside the system using wet etching with high temperature potassium hydroxide (hereinafter "KOH").

Conventional wafer carrier cleaning processes, such as by use of KOH, HCl and $Cl_2$, can be inadequate to remove carbon based compounds and other residual materials from epitaxial processes which are deposited on a wafer carrier. Furthermore, these processes require dedicated personnel or additional complex automation equipment, and present significant issues for modern production of semiconductors. In order to carry out these cleaning processes, conventional systems require removal of the wafer carrier from the reactor and cleaning outside the system, which interrupts production time and potentially results in additional contamination of the process chamber, for example, during removal and insertion of the wafer carrier in order to facilitate the existing cleaning processes.

SUMMARY

To address the shortcomings in wafer cleaning technology, systems and methods for cleaning wafer carriers during MOCVD semiconductor wafer production are disclosed herein. In some embodiments, a carrier cleaning module is coupled to an automatic factory interface. In such embodiments, the carrier cleaning module can be used to clean the wafer carriers prior to undergoing epitaxial growth processing. In another embodiment, a carrier cleaning module can be coupled to a process module transfer chamber. In this embodiment, the wafer carrier can be cleaned by the carrier cleaning module prior to epitaxial growth. In yet another embodiment where wafers require pre-cleaning, carrier cleaning modules can be coupled to both the automatic factory interface and the process module transfer chamber. In this embodiment, the wafer carrier and wafers can be cleaned prior to epitaxial growth processing.

In one embodiment, a metal-organic chemical vapor deposition system for semiconductor wafer production is disclosed. The system includes a process cluster coupled to a first end of a transfer chamber. The process cluster is also configured to apply epitaxial layers on one or more wafers loaded onto a wafer carrier. The system also includes an automatic factory interface coupled to a second end of the transfer chamber. The system includes one or more wafer carrier cleaning modules coupled to the automatic factory interface and configured to clean one or more of the wafer carriers. The system may also have one or more buffer chambers that can hold one or more carriers. The buffer chambers can be used for staging, as well as heat-up prior to cleaning or cool-down after cleaning. The cooling function may also be integrated into the transfer module.

In one embodiment, a chemical vapor deposition system for semiconductor wafer production is provided. The system comprises a transfer chamber having a first end and a second end; an automatic factory interface operably coupled to the first end of the transfer chamber, the automatic factory interface chamber configured to load and unload one or more wafers from one or more wafer carriers; one or more wafer carrier cleaning modules directly coupled to the automatic factory interface, the one or more wafer cleaning modules configured to automatically clean the one or more of the wafer carriers, the one or more wafer carrier cleaning modules further including one or more surface characterization tools to detect one or more surface characteristics of the one or more wafer carriers; and a process cluster operably coupled to the second end of the transfer chamber, the process cluster comprising one or more processing modules.

In another embodiment, a method for cleaning wafer carriers of a metal-organic chemical vapor deposition system is provided. The method comprises loading a wafer carrier from an automatic factory interface into a wafer carrier cleaning module coupled directly thereto; cleaning the wafer carrier within the wafer carrier cleaning module; inspecting the cleaned wafer carrier using one or more surface characterization tools to determine if the wafer carrier has been properly cleaned or has not been properly cleaned; and moving, via the one or more robots, the properly cleaned wafer carrier from the wafer carrier cleaning module into the automatic factory interface for further processing.

In another embodiment, a wafer carrier cleaning system is provided. The cleaning system comprises a chamber; a support for supporting a wafer carrier mounted within the chamber; one or more gas injectors mounted within the chamber for injecting one or more cleaning gases; a heater; and one or more surface characterization tools to detect one or more surface characteristics of the wafer carrier.

In another embodiment, a method of cleaning wafer carriers is provided. The method comprises loading a wafer carrier in need of cleaning into a cleaning chamber; injecting one or more cleaning gases into the cleaning chamber; activating the one or more cleaning gases at a temperature ranging from about 400° C. to about 1000° C. under a pressure ranging from about 100 Torr to about 760 Torr; exposing surfaces of the wafer carrier to the activated one or more cleaning gases; and inspecting the wafer carrier surfaces using one or more surface characterization tools to determine if the wafer carrier has been cleaned.

In another embodiment, a chemical vapor deposition system for semiconductor wafer production is provided. The system comprises a transfer chamber having a first end and a second end; an automatic factory interface operably coupled to the first end of the transfer chamber, the automatic factory interface configured to load and unload one or more wafers from one or more wafer carriers; a process cluster operably coupled to the second end of the transfer chamber, the process cluster comprising one or more processing modules; and one or more wafer carrier cleaning modules directly coupled to the process cluster configured to automatically clean the one or more of the wafer carriers within the wafer carrier cleaning module, the one or more wafer carrier cleaning modules further comprising one or more surface characterization tools to detect one or more surface characteristics of the one or more wafer carriers.

In use, various embodiments for cleaning wafer carriers of metal-organic chemical vapor deposition systems can include loading a wafer carrier from the automatic factory interface into a wafer carrier cleaning module. The method can also include cleaning the wafer carrier at the same pressure as the automatic factory interface. The method can further include removing the wafer carrier from the wafer carrier cleaning module and moving the wafer carrier back into the automatic factory interface.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Subject matter hereof may be more completely understood in consideration of the following detailed description of various embodiments in connection with the accompanying figures, in which:

FIG. 1A is a partial schematic view of an alternate embodiment of a metal-organic chemical vapor deposition system, according to embodiments disclosed herein.

Figure 1:
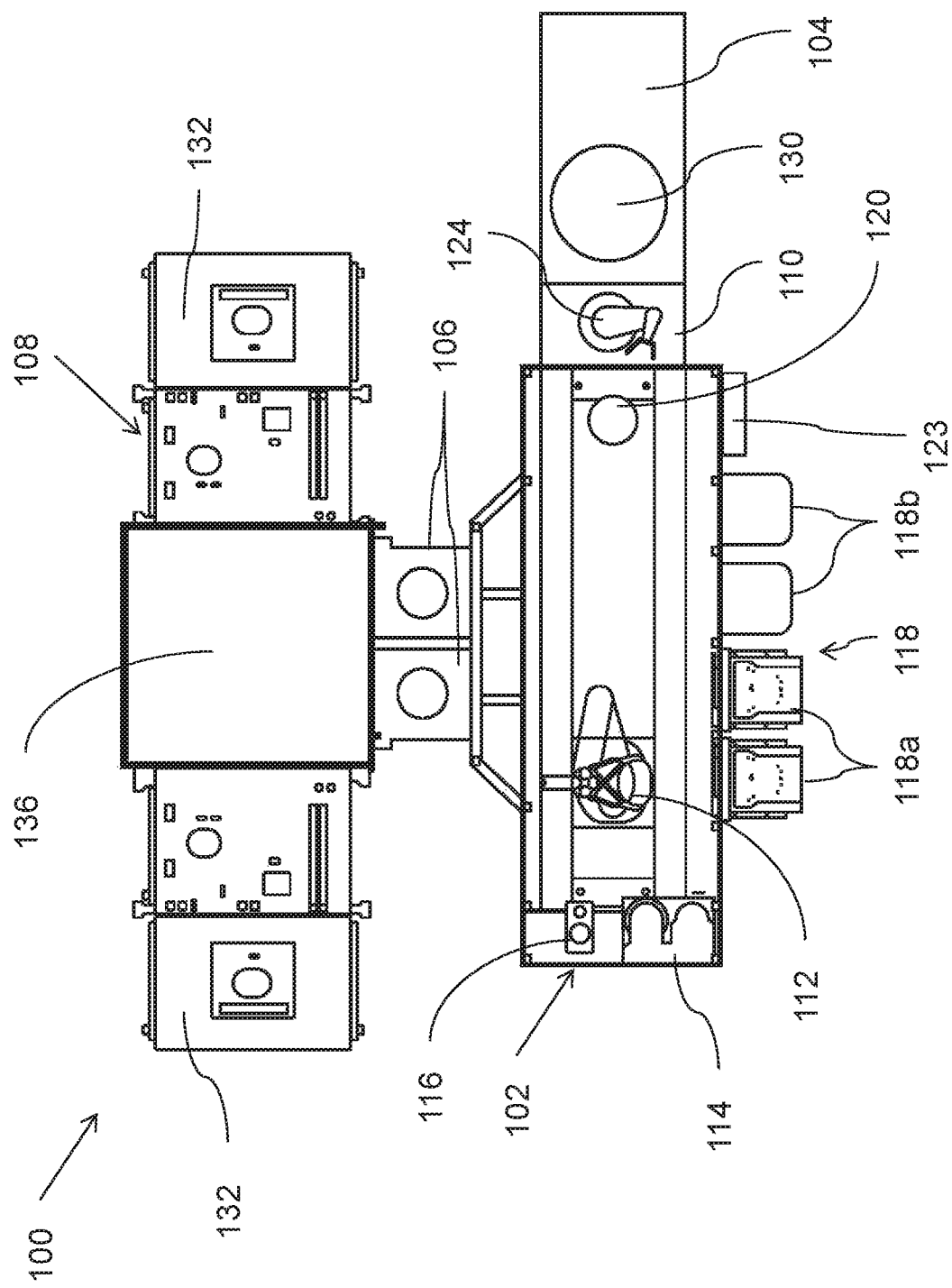
FIG. 1 is a schematic view of a metal-organic chemical vapor deposition system, according to embodiments disclosed herein.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Described herein are systems and methods for cleaning wafer carriers during an MOCVD semiconductor wafer carrier production. In some embodiments, a carrier cleaning module (hereinafter "CCM") is operably coupled to an automatic factory interface (hereinafter "AFI"). In this embodiment, the CCM can be used to clean the wafer carriers prior to being loaded with wafers which undergo epitaxial growth processing. In another embodiment, a CCM can be operably coupled to the process module transfer chamber (hereinafter "PMTC"). In this embodiment, the wafer carrier can be cleaned by the CCM prior to being loaded with wafers which undergo epitaxial growth processing. In yet another embodiment where wafers require pre-cleaning, a CCM can be coupled to the AFI and a CCM suitable for cleaning wafers can be coupled to the PMTC. In this embodiment, the wafer carrier can be cleaned prior to being loaded with wafers which undergo epitaxial growth processing and the wafers can be pre-cleaned prior to being loaded onto cleaned wafer carriers.

Referring now to FIG. 1, an MOCVD processing system 100 is depicted. It should be understood that in alternative embodiments, other types of CVD processing could be used, and MOCVD is described solely for purposes of this embodiment. In the embodiment shown in FIG. 1, MOCVD processing system 100 includes an AFI 102, an AFI CCM 104, transfer chambers 106, and processing cluster 108. In this embodiment, AFI CCM 104 is operably coupled to AFI 102 via CCM transfer chamber 110. Further, AFI 102 is operably coupled to processing cluster 108 via transfer chambers 106.

AFI 102 is a part of the MOCVD processing system 100 that is used for storing, preparing, and moving wafers and wafer carriers that are going into or being removed from the processing cluster 108. A typical AFI includes a mechanism for moving wafers and wafer carriers, and mechanisms for loading or unloading wafers from wafer carriers. The mechanism for moving wafers and wafer carriers is used as a preparatory stage for wafers that are complete, or for substrates that are ready to be inserted into a reactor chamber. AFI 102 is also used to maintain appropriate conditions in adjacent componentry. For example, AFI 102 can include vacuum controls, purge gas inlets, and/or temperature controls that are configured to pre-condition the materials that are transferred to processing cluster 108 via transfer chambers 106.

In the embodiment shown in FIG. 1, AFI 102 includes an AFI robot 112, wafer loading and unloading station 114, wafer alignment station 116, one or more Front Opening Universal Pods (hereinafter "FOUP s") 118, operably connected to AFI 102, and an intermediate staging station 120. AFI 102 can also include a maintenance door 123 for personnel access to AFI 102 or AFI 202.

AFI robot 112 manipulates and moves wafers and wafer carriers within AFI 102. In some embodiments, AFI robot 112 includes a multi-axis robotic arm operated via a computerized or numerically controlled processing system. Further, AFI robot 112 includes an end effector capable of manipulating both wafers and wafer carriers within AFI 102. AFI robot 112 can be configured to move wafer carriers from FOUPs 118a to wafer loading and unloading station 114 where it is staged for wafer loading. AFI robot 112 can then retrieve wafers from FOUPs 118b and place them on the wafer carrier. Once the wafer carrier is filled, AFI robot 112 can move the wafer carrier to wafer alignment station 116. Once the wafers are aligned, AFI robot 112 can move the wafer carrier to either intermediate staging station 120 or to transfer chambers 110.

Wafer loading and unloading station 114 can be configured to provide access for loading one or more wafers onto a wafer carrier prior to epitaxial growth processing. Wafer loading and unloading station 114 is also configured to provide access for unloading one or more processed wafers. Wafer alignment station 116 is configured to properly align the wafers on the wafer carrier. Wafer loading and unloading station 114 and wafer alignment station 116 can be arranged proximate one another as loading of wafers require subsequent alignment.

One or more FOUPs 118 can be arranged on AFI 102 and further configured for pre-process wafer loading, wafer in-process storage, wafer carrier storage, and wafer after-process transportation packaging. FOUPs 118 can include a shelving system configured for securing wafers and wafer carriers during transportation. FOUPs 118 also include a climate controllable housing with an access door on one side of the housing. FOUPs 118 are configured such that when it is decoupled from the CVD system, FOUP 118 maintains a controlled environment within its housing. Further, the access door can be configured to be opened once coupled to the CVD system. Thus, personnel can transport and store FOUPs 118 outside of the CVD system and then, when needed, couple FOUPs 118 to a portion of the CVD system without exposing the wafers to an uncontrolled environment. Further, the one or more FOUPs 118 can be configured for different sized wafers and wafer carriers. As an example depicted in FIG. 1, a first pair of FOUPs 118a are configured to hold wafer carriers and a second pair of FOUPs 118b are configured to hold wafers. In other embodiments, AFI 102 can include any number of FOUPs 118 configured for any size wafers and wafer carriers, typically corresponding with the type of wafers that are processed in process cluster 108.

Intermediate staging station 120 includes a platform for holding a wafer carrier that is between robotic movements. Intermediate staging station 120 can be configured to be robotically accessible from more than one direction. In other words, AFI robot 112 can place a wafer carrier on intermediate staging station 120 from one direction, yet the wafer carrier can be picked up from a robot coming from another direction as described in more detail below with respect to the AFI CCM 104.

When maintenance door 123 is in a closed position, maintenance door 123 is configured to maintain internal conditions within the CVD system. When maintenance door 123 is open, maintenance door 123 is configured to allow personnel to access the internal chambers of a CVD system for maintenance or repair of internal system components, such as AFI robot 112. Maintenance door 123 is arranged on AFI such that the opening of maintenance door 123 does not expose process cluster 123 or transfer chambers 106 to ambient conditions. In this way, processing can continue within process cluster 108 even while maintenance or cleaning is performed within AFI 102. This is an important and beneficial feature because the loss of hours or even minutes of processing time within a CVD system can be very expensive.

In conjunction with the coupling of AFI CCM 104 to AFI 102, intermediate staging station 120 can be configured to temporarily stage a wafer carrier for transfer from AFI robot 112 to a CCM transfer chamber robot 124 of CCM transfer chamber 110 (i.e., a load-locked CCM). In an alternative embodiment, AFI CCM 104 is coupled to AFI 102 such that AFI robot 112 can manipulate wafer carriers into and out of AFI CCM 104 directly (i.e., and open-load CCM). In other words, AFI CCM 104 can be coupled to AFI 102 such that CCM transfer chamber 110 and CCM transfer chamber robot 124 are omitted from the system.

In embodiments, AFI robot 112 can be arranged on a track such that AFI robot 112 can manipulate wafer carriers throughout AFI 102. For example, AFI robot 112 can take an unloaded wafer carrier from wafer loading and unloading station 114 and move the wafer carrier to intermediate staging station 120 prior to the wafer carrier being cleaned in AFI CCM 104. In the alternative embodiment previously described in which CCM transfer chamber 110 and CCM transfer chamber robot 124 are omitted, AFI robot 112 can place the wafer carrier directly into AFI CCM 104. Once the wafer carrier is cleaned, AFI robot 112 can move the wafer carrier to wafer loading and unloading station 114. There, AFI robot 112 can obtain a wafer and wafer carrier from a respective FOUP 118, load the wafer onto a wafer carrier at wafer loading and unloading station 114, then move the wafer carrier to wafer alignment station 116 for alignment. Once the wafers are aligned in a wafer carrier, AFI robot 112 can move the wafer carrier to one of the plurality of transfer chambers 106.

In this embodiment, AFI CCM 104 includes one or more cleaning systems and a wafer carrier platform 130. AFI CCM 104 can be configured for cleaning one wafer carrier at a time. In this embodiment, AFI CCM 104 can be configured to clean wafer carriers of residual material from previous epitaxial depositions. Residual material can include, for example, group (III) nitride layers, carbon based compounds, and other epitaxial products produced as byproducts of previous MOCVD cycles. AFI CCM 104 can include high temperature etching using HCl or $Cl_2$, for example, to remove group (III) nitride layers from the wafer carriers. AFI CCM 104 can further include a carbon compound removal reactant, such as $N_2O$, subsequently or in combination with the HCl or $Cl_2$.

In embodiments, wafer carrier platform 130 is configured to hold and manipulate the wafer carrier during a cleaning process. Wafer carrier platform 130 can manipulate the wafer carrier during cleaning such that wafer carrier platform 130 rotates, vibrates, inverts, or can be subjected to other types of manipulation required for cleaning processes.

In an alternative embodiment, AFI CCM 104 can be configured for cleaning a plurality of wafer carriers at a time. In this alternative embodiment, AFI CCM 104 can be configured to receive a FOUP loaded with wafer carriers. An advantage of this alternative embodiment is that AFI CCM 104 can clean a plurality of wafer carriers at once and thus increase CVD system efficiency compared to conventional systems.

In one embodiment, AFI CCM 104 can receive a wafer carrier via CCM transfer chamber robot 124 (either alone or acting in concert with AFI robot 112), then AFI CCM 104 can create a cleaning environment. A cleaning environment, for example would be to heat the wafer carrier and surrounding area to a temperature between about 400 and about 1000 C, and maintain pressure within AFI CCM 104 to between about 100 torr to about 760 torr. Once the cleaning environment is established, AFI CCM 104 can pump cleaning reactants for removing group (III) nitride layers and carbon based compounds, such as $Cl_2$ and $N_2O$, respectively, into the cleaning environment for high temperature etching. Additionally, other reactants can also be used: nitrogen trifluoride ($NF_3$), tertrafluoromethane ($CF_4$), sulfur hexafluoride ($SF_6$), hexafluoroethane ($C_2F_6$), carbon tetrachloride ($CCl_4$), hexachloroethane ($C_2Cl_6$), $ClF_3$ and mixtures thereof, for example. Once the high temperature etching is complete, the cleaned wafer carrier can then be removed from AFI CCM 104 via CCM transfer chamber robot 124 or AFI robot 112, and transferred to wafer loading and unloading station 114, for example, for further use.

Because AFI CCM 104 is coupled to AFI 102, AFI CCM 104 can operate cleaning processes under conditions that are similar to those conditions maintained in AFI 102 for increased efficiency. When cleaning processes such as these are used in AFI CCM 104, less chamber environment preparation is required. For example, AFI CCM 104 would be able to begin the cleaning process shortly after being loaded with one or more wafer carriers as temperature, pressure, and gaseous environment may not need to be altered prior to cleaning. This reduces need for additional cleaning, less purging of the chambers as components are moved therebetween, and less time for atmospheric and temperature equilibration before each run, which in turn increases the percentage of time that the reactor can be used for useful deposition. By adding AFI CCM 104 as a separate cleaning module adjacent to AFI 102 and reducing purge time, reactor cluster 108 can be provided clean and ready wafers more rapidly and with less cleaning and purging time required, in an industry where reactor downtime is a primary concern. Damage to the chamber components caused by exposure to the cleaning gases is also avoided.

In alternative embodiments, two or more AFI CCMs 104 can be coupled to AFI 102. In this embodiment, one of the two or more AFI CCMs 104 can operate cleaning processes at atmospheric, or near atmospheric pressures while one or more of the other AFI CCMs 104 can operate at different process pressures, such as a very low pressure. In this configuration, the atmospheric AFI CCM 104 can operate cleaning processes such as thermally activated gasses (e.g., HCl, $Cl_2$, $ClF_3$, etc.). In this same configuration, the low pressure AFI CCM 104 can operate cleaning processes such as various types of plasma cleaning (e.g., inductively coupled plasma etching, reactive ion etching, remote plasma, etc.) In this alternative embodiment, an atmospheric AFI CCM 104 could remove group (III) nitrides using HCl or $Cl_2$, and subsequently use a low-pressure AFI CCM 104 for carbon compound removal. Low-pressure AFI CCM 104 can remove carbon compounds using remote plasma generation of oxygen radicals, for example. In those embodiments with multiple AFI CCMs 104 attached to a single AFI 102, the AFI robot 112 of such a system can be configured to position susceptors (with or without wafers) within reach of the transfer chamber robots 124 of each such AFI CCM 104. That is, the AFI robot 112 and transfer chamber robots 124 can manage the pre-cleaning or post-cleaning of objects that are being passed to or from the reactor cluster 108.

In an embodiment, one or more transfer chambers 106 can be coupled between AFI 102 and processing cluster 108. Transfer chambers 106 can be used when processing cluster 108 is in a load-locked configuration. In this embodiment, transfer chambers 106 are used to bring incoming wafer carriers to processing cluster 108 conditions without disturbing the conditions within processing cluster 108. Similarly, transfer chambers 106 are used to bring outgoing wafer carriers to AFI 102 condition without disturbing the conditions within processing cluster 108.

In this embodiment, processing cluster 108 includes one or more processing modules 132 and a low pressure central transfer module 136. In embodiments, low pressure central transfer module 136 includes a processing cluster robot (not shown). Processing cluster robot is configured to manipulate the wafer carriers between one or more processing modules 132 and a low pressure central transfer module 136. For example, processing cluster robot can take a wafer carrier loaded with wafer substrates out of transfer chambers 106, and move the loaded wafer carrier to one of the one or more processing modules 132 for epitaxial processing. Once an epitaxial processing is completed, processing cluster robot can take the loaded wafer carrier out of the one or more processing modules 132, and move it to a different processing module 132 for additional processing.

FIG. 1A shows an alternative embodiment of CCM transfer chamber 110, or CCM transfer chamber 210 (discussed further below).

CCM transfer and characterization chamber 110' (or 210' if used in the system shown in FIG. 2) has within it CCM transfer and characterization chamber robot 158, which functions in the same manner as CCM transfer chamber robot 124 as discussed above. In addition, CCM transfer and characterization chamber 110' (or 210') also has surface characterization tools include pyrometers, surface emissivity monitors, thermal imaging devices, surface x-ray analyzers, ultrasonic sensors, optical measuring systems, photometric systems, photoluminescence spectroscopes, x-ray diffraction, eddy current measure, surface defectivity macro inspection, and other non-destructive surface measurement tools and the like. The surface characterization tools can be mounted within the CCM transfer and characterization chamber 110' (or 210') or mounted on top of the CCM transfer and characterization chamber 110' (or 210') with access to the internal chamber through a viewport. The surface characterization tools use are described below. The CCM transfer and characterization chamber robot 158 moves the wafer carrier to be cleaned from AFI 102 (or AFI 202) into CCM transfer and characterization chamber 110' (or 210'). Surface characterization tools are then used to examine the wafer carrier. Wafer carriers with identified cracks and other undesirable characteristics cannot be used in production and have to be removed from the system so that they are no longer used. In addition, replacement wafer carriers must be made available so that the system has the proper amount of wafer carriers to handle the wafers which are loaded into the system to avoid process interruption. Once the wafer carrier has been examined, good wafer carriers to be cleaned are placed into wafer carriers to be cleaned storage area (or FOUP) 154. Those wafer carriers which, after examination, are determined to be not good wafer carriers are placed into damaged wafer carrier storage area (or FOUP) 156. A wafer carrier from wafer carriers to be cleaned storage area 154 is then moved using robot 158 to cleaning module 104 (or 204) for cleaning. After cleaning, robot 158 moves the cleaned wafer carrier to clean carrier storage area (or FOUP) 150. Clean carrier storage area 150 can have cooling areas to cool the cleaned wafer carriers after being cleaned prior to the cleaned wafer carriers being returned to service within the system. Replacement wafer carrier storage area (or FOUP) 152 contains wafer carriers which can be used to replace the not good wafer carriers stored in damaged wafer carrier storage area 154.

Figure 2:
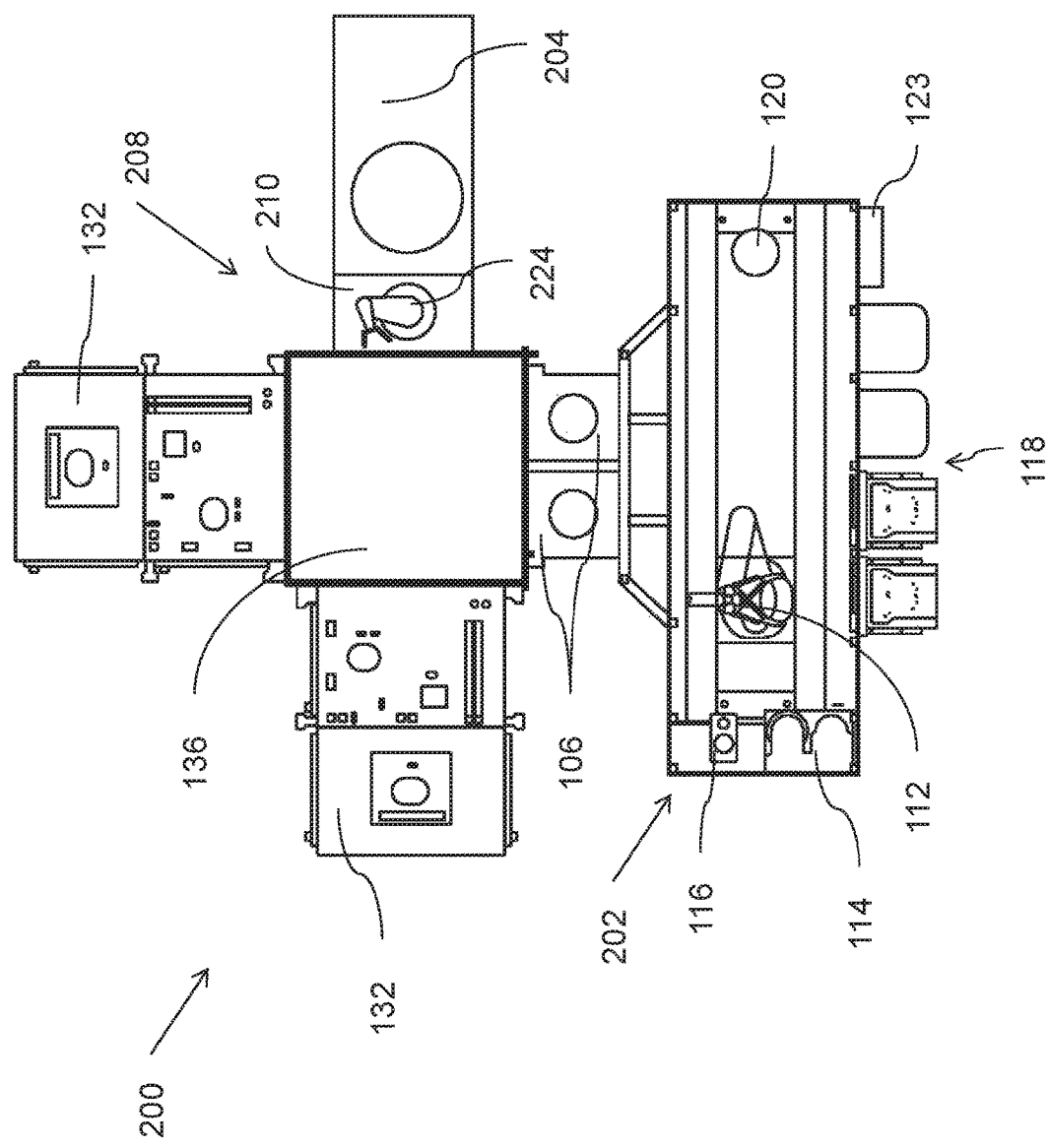
FIG. 2 is a schematic view of a metal-organic chemical vapor deposition system, according to embodiments disclosed herein.

An alternative embodiment of an MOCVD processing system 200 is depicted in FIG. 2. In this embodiment, MOCVD processing system 200 includes AFI 202, which is identical to AFI 102 shown in FIG. 1. The embodiment shown in FIG. 2 includes a processing cluster CCM 204 operably coupled to processing cluster 208 and not AFI 202. MOCVD system 200 further includes transfer chambers 106 and a processing cluster 208 similar to those described above. In this embodiment, processing cluster CCM 204 is coupled to processing cluster 208 at low pressure central transfer module 136. Further, wafer carriers are loaded and unloaded into processing cluster CCM 204 via processing cluster robot as are the one or more processing modules 132.

In one embodiment, processing cluster CCM 204 includes a CCM transfer chamber 210 and CCM transfer chamber robot 224 where processing cluster CCM 204 requires a load-locked configuration. In an alternative embodiment, CCM transfer chamber 210 and CCM transfer chamber robot 224 are omitted where processing cluster CCM 204 is operating in an open-lock configuration.

In this embodiment, processing cluster CCM 204 operates at a low pressure as do the one or more processing modules. Because processing cluster CCM 204 is inherently at a low pressure due to its location in the system, processing cluster CCM 204 can perform cleaning processes requiring low pressure without the added process time of pumping air out of processing cluster CCM 204 prior to cleaning. Thus, processing cluster CCM 204 is capable of performing cleaning processes such as various types of plasma cleaning (e.g., inductively coupled plasma etching, reactive ion etching, remote plasma, etc.).

In this embodiment, a wafer carrier to be cleaned is moved via AFI robot 112 from loading and unloading station 114 or, alternatively AFI robot 112 takes a wafer carrier from FOUPs 118a. AFI robot 112 then moves the wafer carrier to transfer chamber 106. Transfer chamber 106 is then pumped to decrease pressure to the pressure of process cluster 208. Processing cluster robot then removes the wafer carrier from transfer chamber 106 and places it into CCM transfer chamber 210. CCM transfer chamber robot 224 then moves the wafer carrier into processing cluster CCM 204 for cleaning. In the alternative embodiment where processing cluster CCM 204 is in an open-lock configuration, processing cluster robot removes the wafer carrier from transfer chamber 106 and places it directly into processing cluster CCM 204. Once the wafer carrier is cleaned, processing cluster robot then removes the wafer carrier from processing cluster CCM 204 and places it back into transfer chamber 106. Once transfer chamber 106 is at a condition similar to the conditions of AFI 202, AFI robot 112 removes the wafer carrier from transfer chamber 106 and places it into loading and unloading station 114 for wafer substrate loading.

Figure 3:
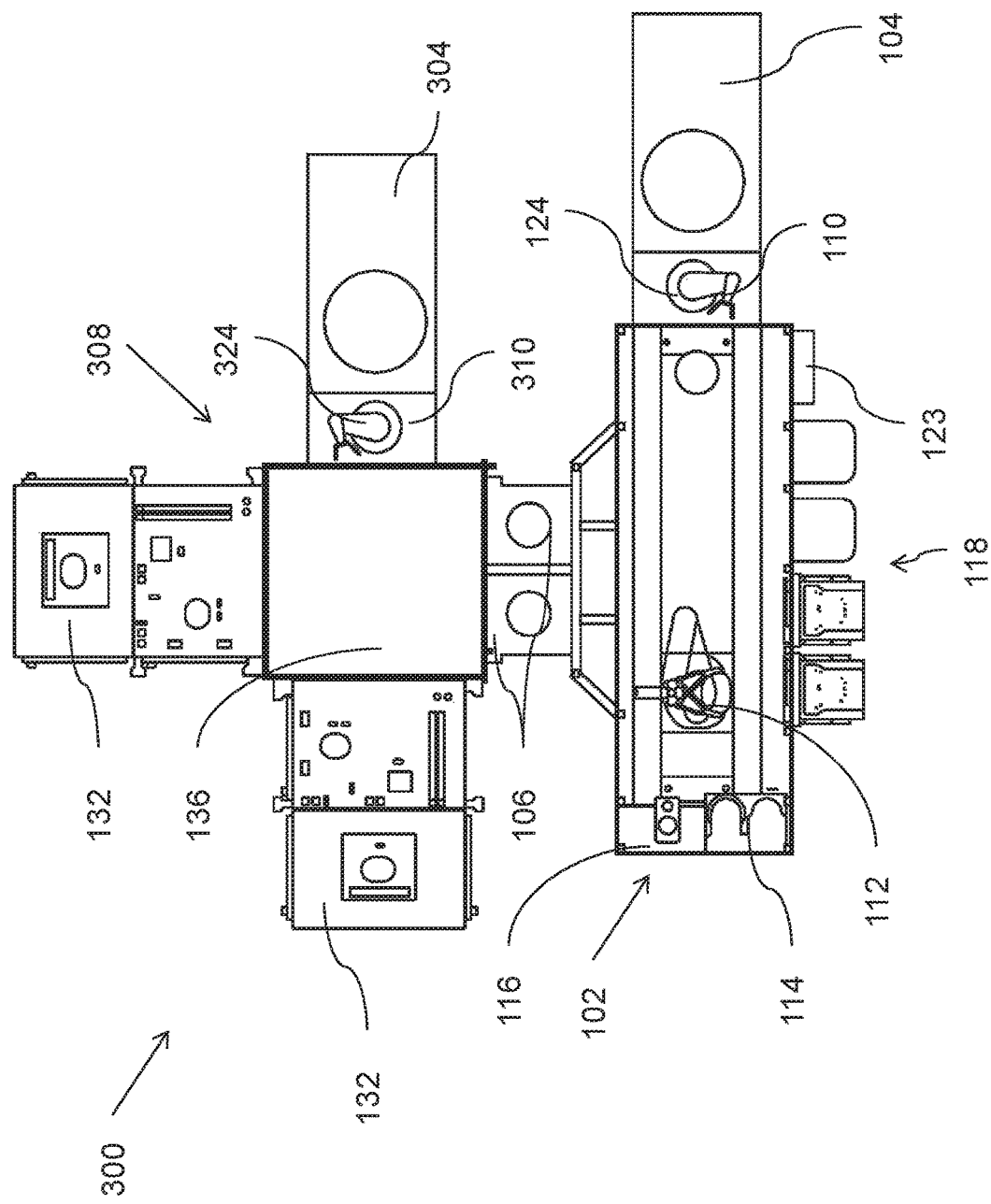
FIG. 3 is a schematic view of a metal-organic chemical vapor deposition system, according to embodiments disclosed herein.

In an alternative embodiment, an MOCVD processing system 300 is depicted in FIG. 3. In this embodiment, MOCVD processing system 300 includes a wafer cleaning module 304 coupled to a processing cluster 308. In this embodiment, wafer cleaning module 304 is configured for pre-cleaning wafers loaded onto a wafer carrier within processing cluster 308. Wafer cleaning module 304 and AFI CCM 104 can comprise the same mechanical components but operated at different parameters and cleaning agents. The use of both an AFI-coupled cleaning module 104 and a reactor-cluster-coupled cleaning module 304 provides more flexibility and efficiency in preparing and post-conditioning wafers and wafer carriers without increasing reactor downtime.

Figure 4:
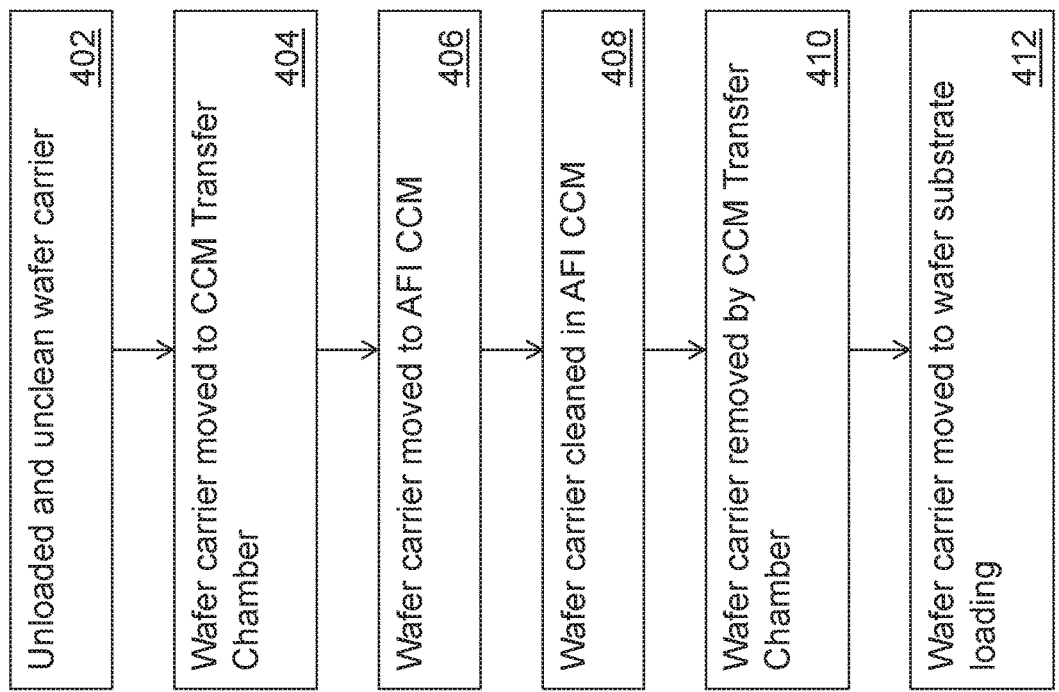
FIG. 4 is a flowchart for cleaning a wafer carrier in a metal-organic chemical vapor deposition system, according to embodiments disclosed herein in a system where a carrier cleaning module is adjacent the automatic factory interface (AFI).

In use and as depicted in FIG. 4, wafer carriers are cleaned in MOCVD processing system 100 and 300 in AFI CCM 104. An unloaded and unclean wafer carrier is taken from FOUPs 118a, intermediate staging station 120, wafer loading and unloading station 114, or any location within MOCVD system 100 or 300 at Step 402. The unclean and unloaded wafer carrier is moved to CCM transfer chamber 110 at Step 404. CCM transfer chamber robot 124 then moves the unloaded and unclean wafer carrier into AFI CCM 104 at Step 406. The unloaded and unclean wafer carrier is then cleaned in AFI CCM 104 under temperature and pressure conditions suitable for cleaning wafer carriers at Step 408. Once the unloaded and unclean wafer carrier is cleaned, CCM transfer chamber robot 124 removes the now unloaded and clean wafer carrier from AFI CCM 104 at Step 410. AFI robot 112 then moves the unloaded and clean wafer carrier into loading and unloading station 114 for wafer substrate loading at Step 412, or to any other wafer carrier handling position within the MOCVD system 100 or 300.

Figure 5:
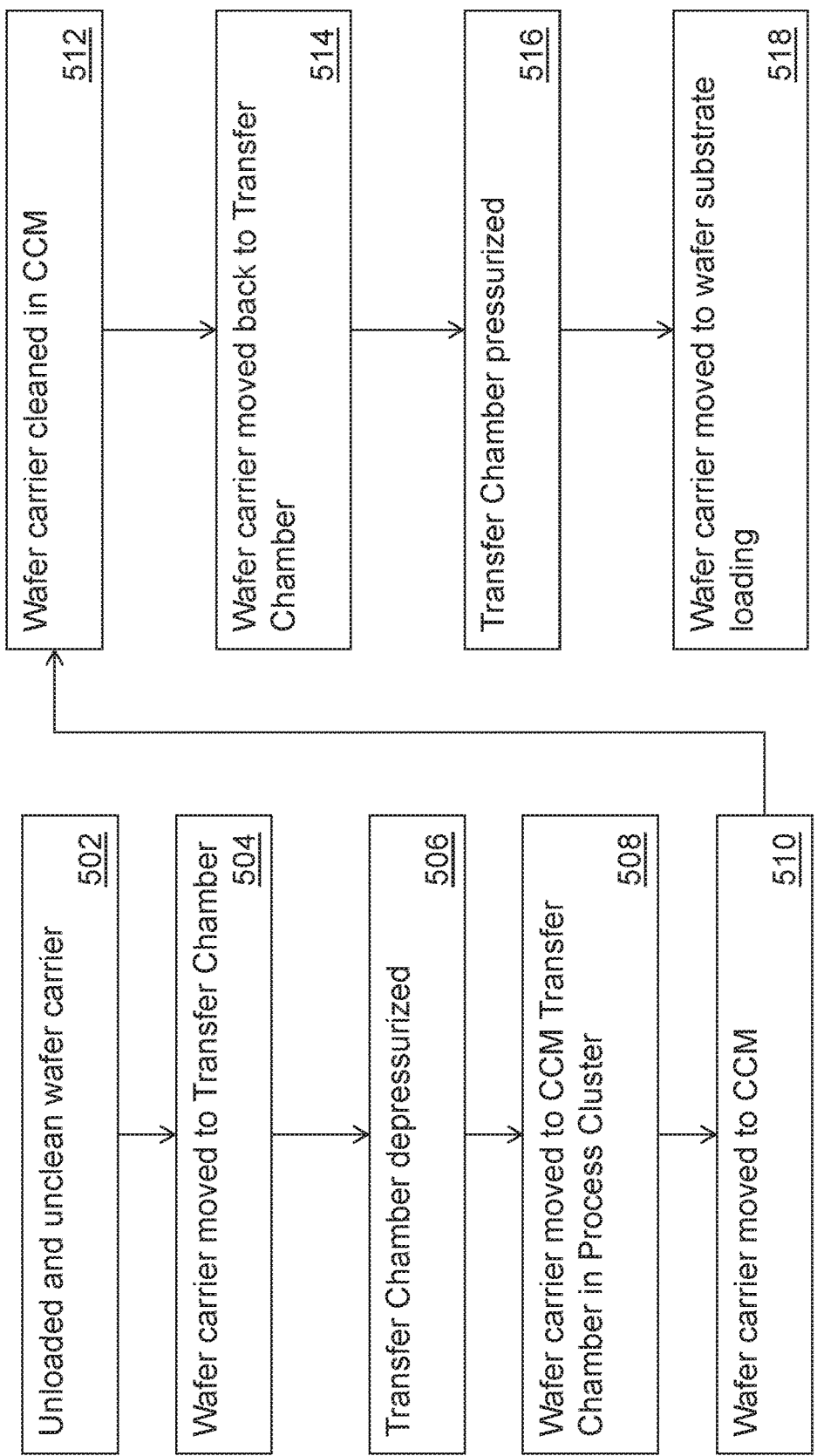
FIG. 5 is a flowchart for cleaning a wafer carrier in a metal-organic chemical vapor deposition system, according to embodiments disclosed herein in a system where a carrier cleaning module is adjacent the processing cluster.

In use and as depicted in FIG. 5, wafer carriers are cleaned in MOCVD processing system 200. AFI robot 112 unloads wafers from a wafer carrier in need of cleaning at loading and unloading station 114 or, alternatively AFI robot 112 takes a wafer carrier from FOUPs 118*a* at Step 502. AFI robot 112 then moves the wafer carrier to transfer chamber 106 at Step 504. Transfer chamber 106 is then conditioned to match the conditions (e.g., pumped to decrease pressure, heated, and placed under a different gaseous environment) of process cluster 208 at Step 506. Processing cluster robot then removes the wafer carrier from transfer chamber 106 and places it into CCM transfer chamber 210 at Step 508. CCM transfer chamber robot 224 then moves the wafer carrier into processing cluster CCM 204 at Step 510. Wafer carrier is then cleaned in processing cluster CCM 204 at Step 512. Once the wafer carrier is cleaned, processing cluster robot then removes the wafer carrier from processing cluster CCM 204 and places it back into transfer chamber 106 at Step 514. Once transfer chamber 106 is under the conditions similar to those of AFI 102 at Step 516, AFI robot 112 removes the wafer carrier from transfer chamber 106 and places it into loading and unloading station 114 for wafer substrate loading at Step 518.

Figure 6:
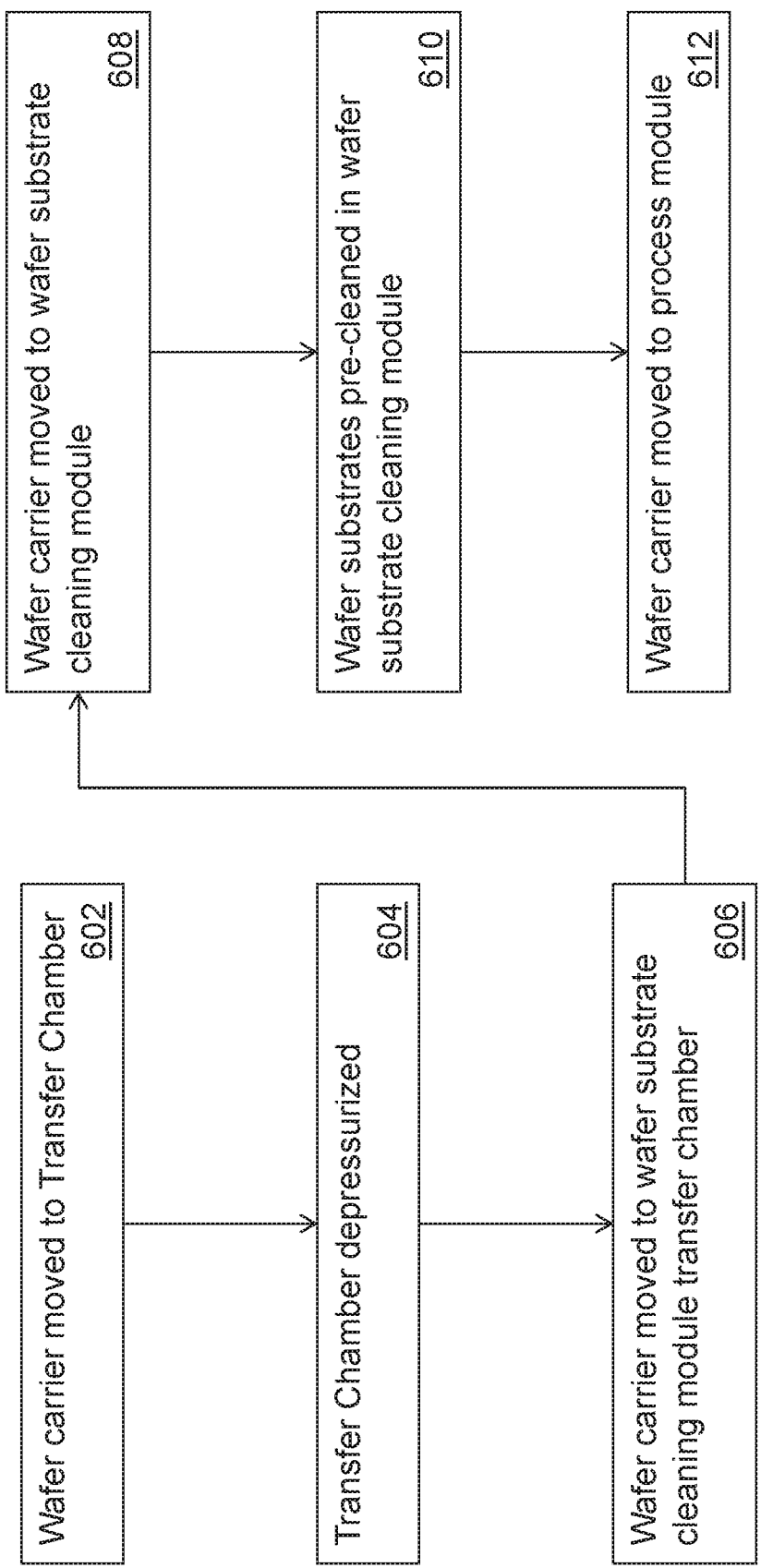
FIG. 6 is a flowchart for pre-cleaning a wafer substrate in a metal-organic chemical vapor deposition system, according to embodiments disclosed herein.

In use and as depicted in FIG. 6, wafer substrates are cleaned in MOCVD processing system 300. AFI robot 112 places a loaded wafer carrier in transfer chamber 106 at Step 602. Transfer chamber 106 is then conditioned to match the conditions of process cluster 308 at Step 604. Processing cluster robot then removes the loaded wafer carrier from transfer chamber 106 and places it into wafer substrate cleaning module transfer chamber 310 at Step 606. The loaded wafer carrier is then moved to the wafer substrate cleaning module 304 at Step 608. The wafer substrates are then pre-cleaned in wafer substrate cleaning module 304 at Step 610. The loaded wafer carrier is then removed from wafer substrate cleaning module 304 and placed in a process module 134 for epitaxial growth processing at Step 612.

Figure 7A:
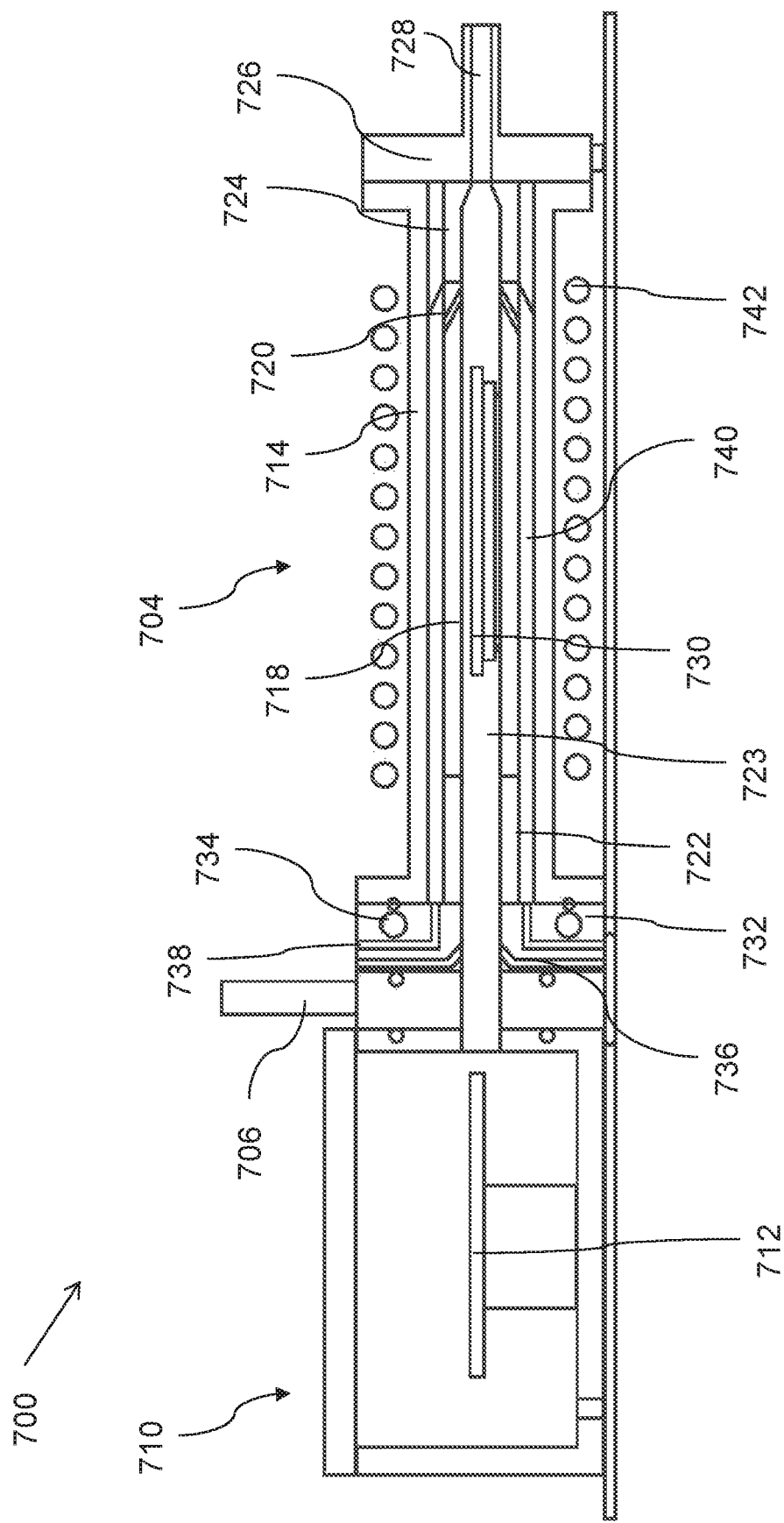
FIG. 7A is a cross-section view of a carrier cleaning system, according to embodiments disclosed herein.

Referring now to FIG. 7A, an embodiment of a CCM 700 is shown. CCM 700 is a cleaning system that is couplable to an AFI, such as AFI CCM 102 or as processing cluster CCM 204 and CCM transfer chamber 210 coupled to processing cluster 208. In this embodiment, cluster cleaning system 700 includes a processing cluster CCM 704 and a CCM transfer chamber 710.

In embodiments, processing cluster CCM 704 and CCM transfer chamber 710 are coupled together via gate valve 706. Gate valve 706 is configured to selectively close and open to allow wafer carriers to pass into and out of processing cluster CCM 704. Gate valve 706 is also configured to maintain a cleaning environment within the cleaning chamber of processing cluster CCM 704 when gate valve 706 is in a closed position. Gate valve 706 can be made of stainless steel, aluminum, nickel plated aluminum, or any other material suitable for CVD manufacturing environments.

In this embodiment, CCM transfer chamber 710 includes a staging platform 712. Staging platform 712 holds unclean and unloaded carrier prior-to or subsequent a cleaning cycle. Staging platform 712 can also include robotic facility by including a CCM transfer chamber robot 124, as described in more detail above. CCM transfer chamber 710 can include heated walls, ultraviolet heating elements, vacuum pumps, purge or cleaning fluid inlets, and other environmental conditioning components. In this way, CCM transfer chamber 710 can be configured to depressurize and condition a carrier prior to entering processing cluster CCM 704.

Processing cluster CCM 704 includes a quartz chamber 714 and a graphite chamber 718. Quartz chamber 714 is configured to house the cleaning chamber and cleaning chamber components. Graphite chamber 718 is arranged within quartz chamber 714. Graphite chamber 718 includes exhaust dilution apertures 720 and, at a first end, inlet block 722. The internal portion of graphite chamber 718 defines a cleaning chamber 723. At a second end, graphite chamber 718 includes an exhaust block 724. Quartz chamber 714 and graphite chamber 718 are coupled at respective second ends via exhaust block 724. In some embodiments, inlet block 722 and exhaust block 724 are made of graphite material and can be formed integrally with graphite chamber 718. In this embodiment, inlet block 722, exhaust block 724, and graphite chamber 718 can be monolithic in structure. In alternative embodiments, inlet block 722, exhaust block 724, and graphite chamber 718 can be formed of separate components made of graphite or varied suitable materials.

Processing cluster CCM 704 also includes an exhaust flange 726. Exhaust flange 726 further includes an exhaust aperture 728. Exhaust flange 726 is coupled to exhaust block 724 and to the second end of quartz chamber 714. Exhaust aperture 728 of exhaust flange 726 is configured to gather and direct exhaust gases out of cleaning chamber 723.

Processing cluster CCM 704 further includes a wafer carrier platform 730. Wafer carrier platform 730 is configured to hold and manipulate the wafer carrier during a cleaning process. Wafer carrier platform 730 can manipulate the wafer carrier during cleaning such that wafer carrier platform 730 rotates, vibrates, inverts, or can be subjected to other types of manipulation required for cleaning processes. In some embodiments, wafer carrier platform 730 can be fixed during a cleaning cycle.

In embodiments, processing cluster CCM 704 includes one or more injector modules 732. Injector module 732 is arranged between gate valve 706 and the first end of quartz chamber 714 and the first end of graphite chamber 718. Injector module 732 also includes one or more cooling channels 734, one or more cleaning reactant injectors 736, and one or more purge injectors 738. One or more cooling channels 734 are arranged throughout injector modules 732 and are configured to direct cooling fluid through injector modules 732. Thus, one or more cooling channels 734 are configured to circulate cooling fluid for absorption and removal of heat. In other embodiments, one or more cooling channels 734 can be arranged in other portions of processing cluster CCM 704.

One or more cleaning reactant injectors 736 of injector modules 732 are configured to fluidly couple cleaning reactant supply with cleaning chamber 723 at the first end of cleaning chamber 723. One or more cleaning reactant injectors 736 can be configured to pump removal reactants for removing group (III) nitride layers and carbon based compounds, such as $Cl_2$ and $N_2O$, respectively, into the cleaning environment for high temperature etching. Additionally, other reactants can also be used; nitrogen trifluoride ($NF_3$), tertrafluoromethane ($CF_4$), sulfur hexafluoride ($SF_6$), hexafluoroethane ($C_2F_6$), carbon tetrachloride ($CCl_4$), hexachloroethane ($C_2Cl_6$), and mixtures thereof, for example. One or more cleaning reactant injectors 736 is arranged at the first end of cleaning chamber 723 such that cleaning reactants pass over and around wafer carrier platform 730 prior to exiting through exhaust aperture 728 of exhaust flange 726.

One or more purge injectors 738 of injector modules 732 are configured to fluidly couple to a chamber gap 740. Chamber gap 740 is formed between the inner surface of quartz chamber 714 and the outer surface of graphite chamber 718. Chamber gap 740 is further formed at a first end by injector module 732 and at a second end by exhaust block 724. Chamber gap 740 is configured to be fluidly connected at a first end to one or more purge injectors 738 and fluidly connected at a second end to exhaust dilution apertures 720. One or more purge injectors 738 of injector modules 732 are configured to rout inert purge gas, such as $N_2$, through chamber gap 740 and then through exhaust dilution apertures 720. Exhaust dilution apertures 720 then route the inert purge gas into exhaust block 724 where the inert purge gas mixes with the removal reactants from cleaning chamber 723. The inert purge gas and removal reactant gas mixture is then routed through exhaust aperture 728 of exhaust flange 726.

In some embodiments of cluster cleaning system 700, processing cluster CCM 704 also includes a radiofrequency heating coil 742. Radiofrequency heating coil 742 is arranged exterior to quartz chamber 714. Radiofrequency heating coil 742 is sized and shaped to effect radio frequency heating within cleaning chamber 723 of graphite chamber 718. Graphite chamber 718 includes a graphite composition suitable for radiofrequency heating. Radiofrequency heating coil 742 and graphite chamber 718 can be configured to provide heating for cleaning chamber 723, wafer carrier, and wafer carrier platform 730 during cleaning cycles. In some embodiments, Radiofrequency heating coil 742 and graphite chamber 718 can be sized and shaped to heat a portion of cleaning chamber 723 that is approximately 1.5 to 2.5 times longer than wafer carrier platform 730. In other embodiments, radiofrequency heating coil 742 and graphite chamber 718 can be sized and shaped to heat a portion of cleaning chamber 723 that is approximately ½ to 1.5 times longer than wafer carrier platform 730.

Figure 7B:
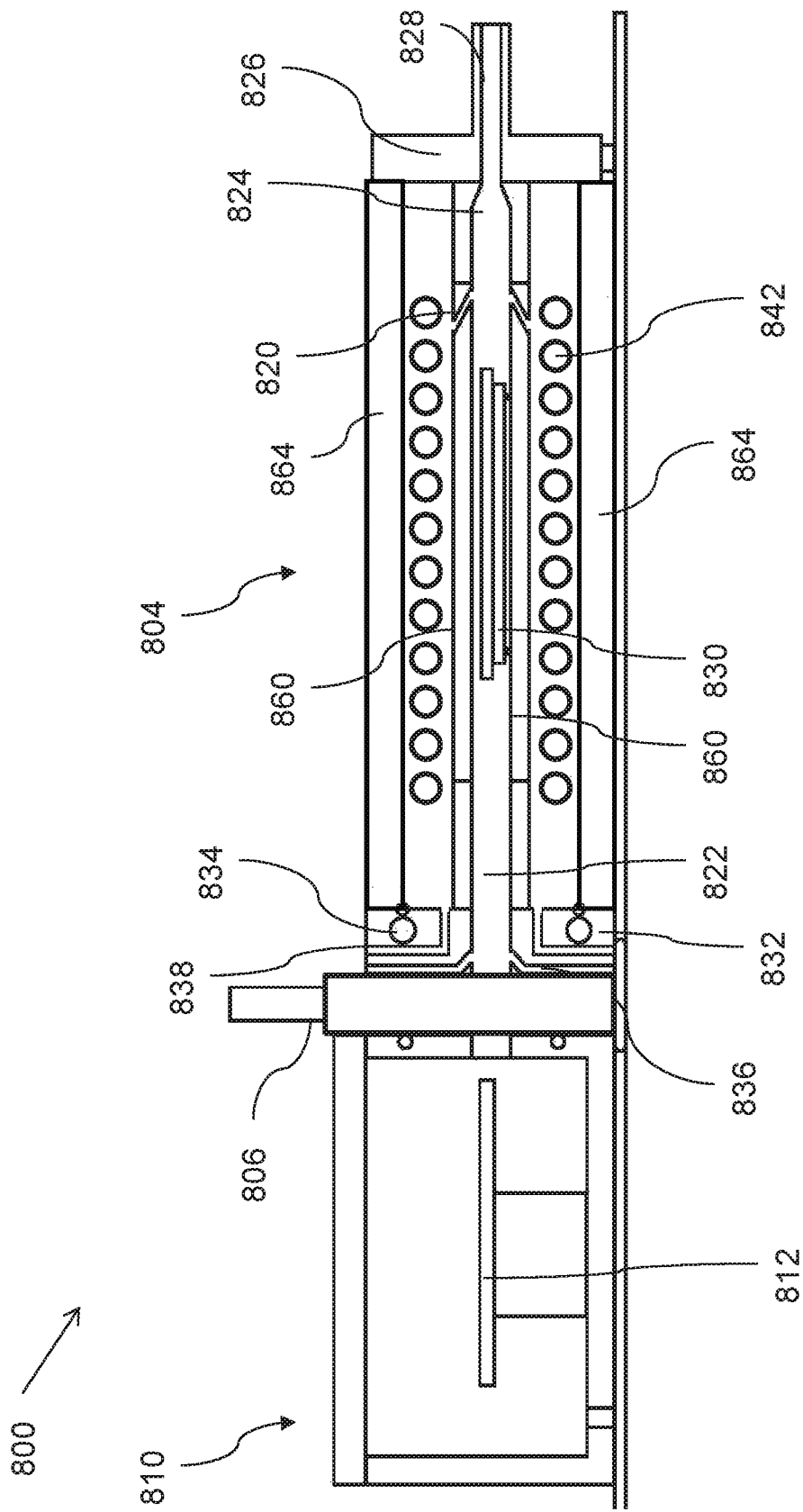
FIG. 7B is a cross-section view of a carrier cleaning system, according to embodiments disclosed herein.

Referring now to FIG. 7B, another embodiment of a cluster cleaning system 800 is shown. Cluster cleaning system 800 is a CCM system that is couplable to an AFI, such as AFI CCM 102 or as processing cluster CCM 204 and CCM transfer chamber 210. In this embodiment, cluster cleaning system 800 includes a processing cluster CCM 804 and a CCM transfer chamber 810.

In embodiments, processing cluster CCM 804 and CCM transfer chamber 810 are coupled together via gate valve 806. Gate valve 806 is configured to selectively close and open to allow wafer carriers to pass into and out of processing cluster CCM 804. Gate valve 806 is also configured to maintain a cleaning environment within the cleaning chamber of processing cluster CCM 804 when gate valve 806 is in a closed position. Gate valve 806 can be made of stainless steel, aluminum, nickel plated aluminum, or any other material suitable for CVD manufacturing environments.

In this embodiment, CCM transfer chamber 810 includes a staging platform 812. Staging platform 812 holds a loaded carrier prior-to or subsequent a cleaning cycle. Staging platform 812 can also include robotic facility by including a CCM transfer chamber robot 124, as described in more detail above. CCM transfer chamber 810 can include heated walls, ultraviolet heating elements, vacuum pumps, purge or cleaning fluid inlets, and other environmental conditioning components. In this way, CCM transfer chamber 810 can be configured to depressurize and condition a carrier prior to entering processing cluster CCM 804.

Processing cluster CCM 804 includes a quartz spacer 860 and a chamber 864. Quartz spacer 860 isolates cleaning reactant gases (for example, Cl2) from contacting the metal parts of chamber 864. Chamber 864 contains the quartz spacer 860, heater coils 842, and other parts of the CCM 804 as shown in FIG. 7B. Chamber 864 includes exhaust dilution apertures 820 and, at a first end, inlet block 822. The internal portion of chamber 864 defines a cleaning chamber 823. At a second end, chamber 864 includes an exhaust block 824.

Processing cluster CCM 804 also includes an exhaust flange 826. Exhaust flange 826 further includes an exhaust aperture 828. Exhaust flange 826 is coupled to exhaust block 824 and to the second end of chamber 864. Exhaust aperture 828 of exhaust flange 826 is configured to gather and direct exhaust gases out of cleaning chamber 823.

Processing cluster CCM 804 further includes a wafer carrier platform 830. Wafer carrier platform 830 is configured to hold and manipulate the wafer carrier during a cleaning process. Wafer carrier platform 830 can manipulate the wafer carrier during cleaning such that wafer carrier platform 830 rotates, vibrates, inverts, or can be subjected to other types of manipulation required for cleaning processes. In some embodiments, wafer carrier platform 830 can be fixed during a cleaning cycle.

In embodiments, processing cluster CCM 804 includes one or more injector modules 832. Injector module 832 is arranged between gate valve 806 and the first end of chamber 864. Injector module 832 also includes one or more cooling channels 834, one or more cleaning reactant injectors 836, and one or more purge injectors 838. One or more cooling channels 834 are arranged throughout injector modules 832 and are configured to direct cooling fluid through injector modules 832. Thus, one or more cooling channels 834 are configured to circulate cooling fluid for absorption and removal of heat. In other embodiments, one or more cooling channels 834 can be arranged in other portions of processing cluster CCM 804.

One or more cleaning reactant injectors 836 of injector modules 832 are configured to fluidly couple cleaning reactant supply with cleaning chamber 823 at the first end of chamber 864. One or more cleaning reactant injectors 836 can be configured to pump removal reactants for removing group (III) nitride layers and carbon based compounds, such as $Cl_2$ and $N_2O$, respectively, into the cleaning environment for high temperature etching. Additionally, other reactants can also be used; nitrogen trifluoride ($NF_3$), tertrafluoromethane ($CF_4$), sulfur hexafluoride ($SF_6$), hexafluoroethane ($C_2F_6$), carbon tetrachloride ($CCl_4$), hexachloroethane ($C_2Cl_6$), and mixtures thereof, for example. One or more cleaning reactant injectors 836 are arranged at a first end of cleaning chamber 823 such that cleaning reactants pass over and around wafer carrier platform 830 prior to exiting through exhaust aperture 828 of exhaust flange 826.

Heater 842 can be a radiofrequency heating coil as described above, an infrared heater, a resistive heater, a radiant heater, or any other heater typically used in cleaning operations in the CVD field.

Figure 8:
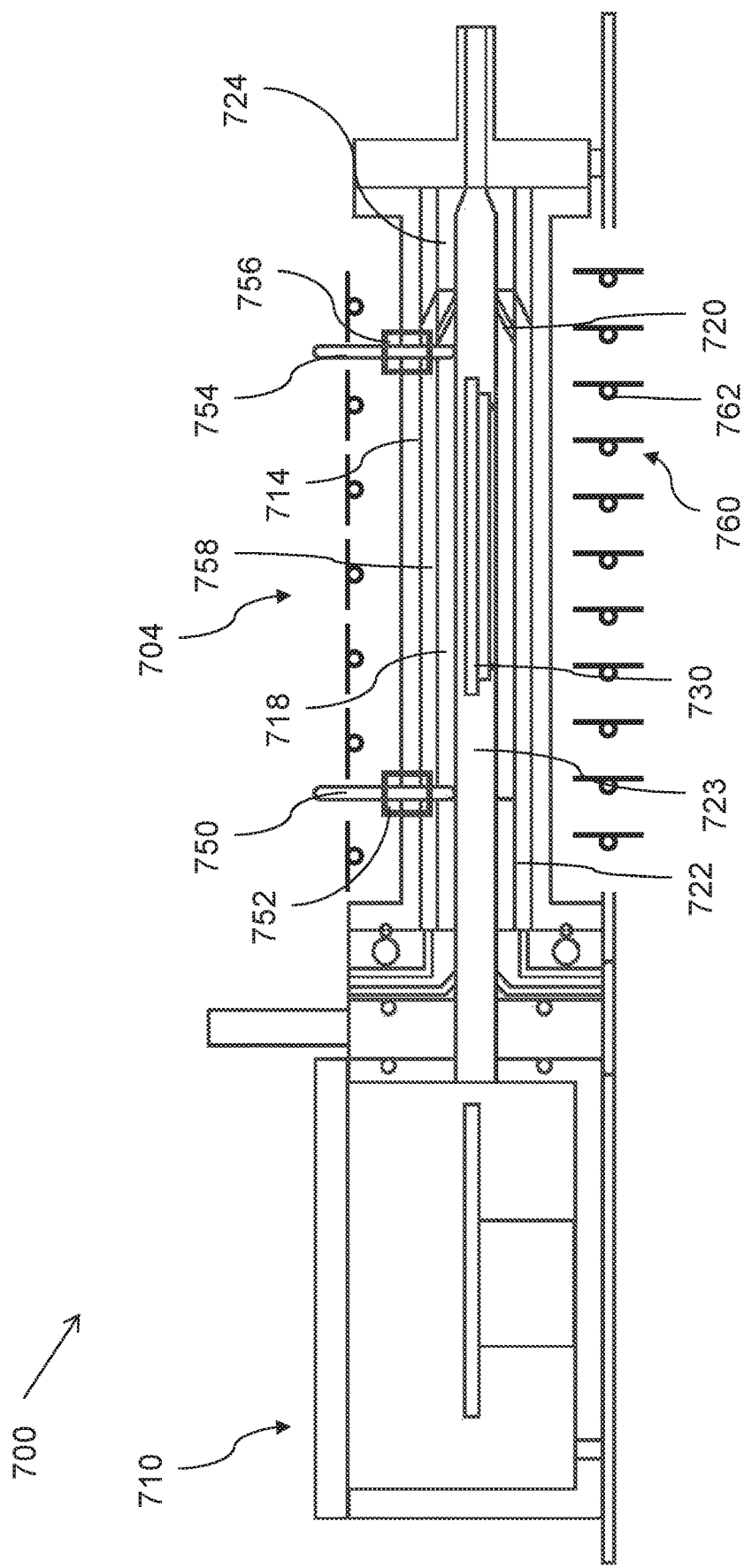
FIG. 8 is a cross-section view of a carrier cleaning system, according to embodiments disclosed herein.

In one embodiment, and as depicted in FIG. 8, processing cluster CCM 704 can also include a first electrode 750 having a first vacuum seal 752 and a second electrode 754 having a second vacuum seal 756. The view shown in FIG. 8 is exploded to show the details of the fluid flow arrangement in one embodiment, though it will be understood that in alternative embodiments other designs could be used that provide cleaning gas or other fluid flow in a laminar manner to uniformly clean a component within the processing cluster CCM 704. In the depicted embodiment, first electrode 750 is electrically coupled to a first end of graphite chamber 718 and second electrode 754 is electrically coupled to a second end of graphite chamber 718 defining graphite heating portion 758. First electrode 750 is also coupled to quartz chamber 714 via first vacuum seal 752. First vacuum seal 752 is configured to electrically insulate quartz chamber 714 from first electrode 750. First vacuum seal 752 can be made of any dielectric material suitable for CVD application environments. Second electrode 754 is also coupled to quartz chamber 714 via second vacuum seal 756. Second vacuum seal 756 is configured to electrically insulate quartz chamber 714 from second electrode 754. Second vacuum seal 756 can be made of any dielectric material suitable for CVD application environments.

In this embodiment, graphite heating portion 758 is arranged between first electrode 750 and second electrode 754 and is configured to electrically couple first electrode 750 and second electrode 754. Graphite heating portion 758 is further configured to provide electrical resistance such that when a voltage potential is applied between first electrode 750 and second electrode 754, graphite heating portion 758 acts as a heating element for cleaning chamber 723 and wafer carrier platform 730. In some embodiments a plurality of first electrode 750 having a first vacuum seal 752 can be arranged around the first ends of graphite chamber 718 and quartz chamber 714, respectfully. Similarly, a plurality of second electrode 754 having a second vacuum seal 756 can be arranged around the second ends of graphite chamber 718 and quartz chamber 714, respectfully. In these embodiments, arrays of first electrodes 750 having a first vacuum seal 752 and arrays of second electrodes 754 having a second vacuum seal 756 can be used to create a suitable electrical heating path across graphite heating portion 758.

In some embodiments, processing cluster CCM 704 can also include a radiant heat shield array 760. Radiant heat shield array 760 can be arranged external to quartz chamber 714 such that radiant heat shield array 760 surrounds quartz chamber 714. Radiant heat shield array 760 can include a plurality of selectively rotatable baffles 762 arranged adjacent one another. Each rotatable baffle 762 can include a flat plate 764 coupled to a rotating drive linkage 766. Flat plate 764 and rotating drive linkage 766 can be made of material suitable to withstand CVD manufacturing environments such as stainless steel, aluminum, or other suitable materials. Flat plate 764 can be configured to have a broad face having a high reflectivity for light in the infrared, visible, and ultraviolet spectrum. Rotating drive linkage 766 can be configured to selectively rotate flat plate 764 such that radiant heat shield array 760 is shiftable between a reflecting position and a transmission position. While radiant heat shield array 760 is only depicted in FIG. 8 where electrical resistance heating is used (i.e., graphite heating portion 758 arranged between first electrode 750 and second electrode 754), radiant heat shield array 760 can be configured for use with any embodiment of cluster cleaning system 700. For example, radiant heat shield array 760 can be implemented in embodiments of cluster cleaning system 700 having radiofrequency-type heating such as the embodiment of processing cluster CCM 704 including radiofrequency heating coil 742 as is depicted in FIG. 7.

The reflecting position of radiant heat shield array 760 can be defined as the broad, reflecting face of flat plate 764 oriented such that it faces quartz chamber 714. Reflecting position of radiant heat shield array 760 is depicted in FIG. 8 in the radiant heat shield array 760 located above quartz chamber 714. The reflecting position of radiant heat shield array 760 is configured to reflect radiant heat emitted by graphite chamber 718, quartz chamber 714, and the cleaning process generally. In this way, reflecting position of radiant heat shield array 760 reflects radiant heat back into cleaning chamber 723 when temperature increase is desired, such as during a heat up period.

The transmission position of radiant heat shield array 760 can be defined as the broad, reflecting face of flat plate 764 being oriented away from quartz chamber 714 at a 90 degree angle, for example. Transmission position of radiant heat shield array 760 is depicted in FIG. 8 in the radiant heat shield array 760 located below quartz chamber 714. The transmission position of radiant heat shield array 760 is configured to allow radiant heat emitted by graphite chamber 718, quartz chamber 714, and the cleaning process generally to pass by radiant heat shield array and exit to the environment. In this way, transmission position of radiant heat shield array 760 directs radiant heat away from cleaning chamber 723 when temperature decrease is desired, such as during a cool down period.

Figure 9A:
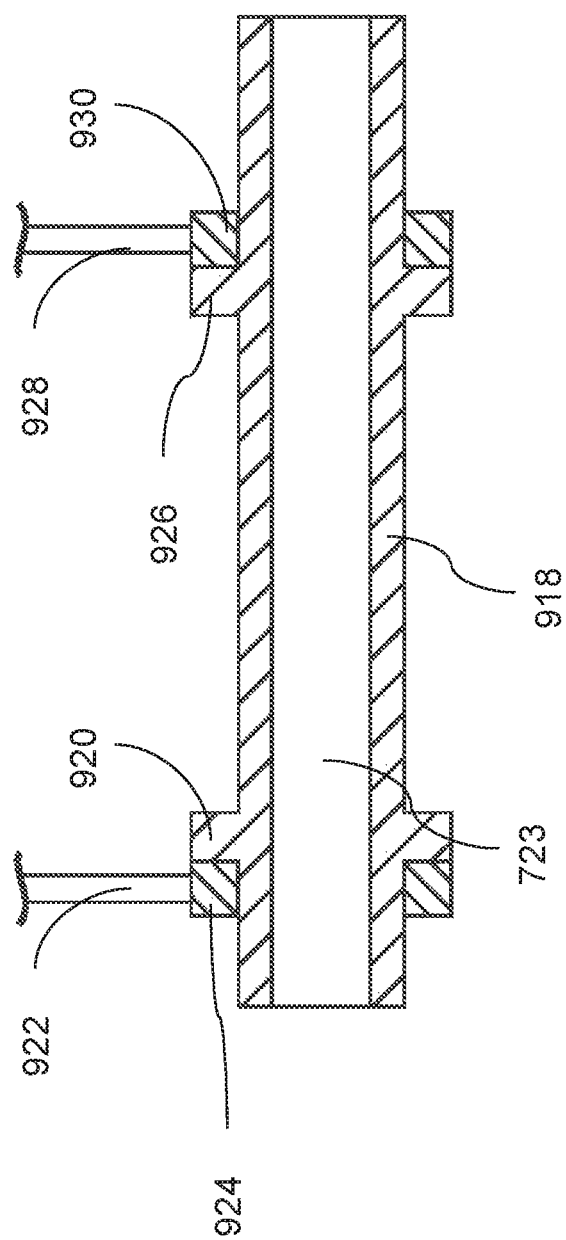
FIG. 9A is a cross-section view of a graphite chamber of a carrier cleaning system, according to embodiments disclosed herein.
Figure 9B:
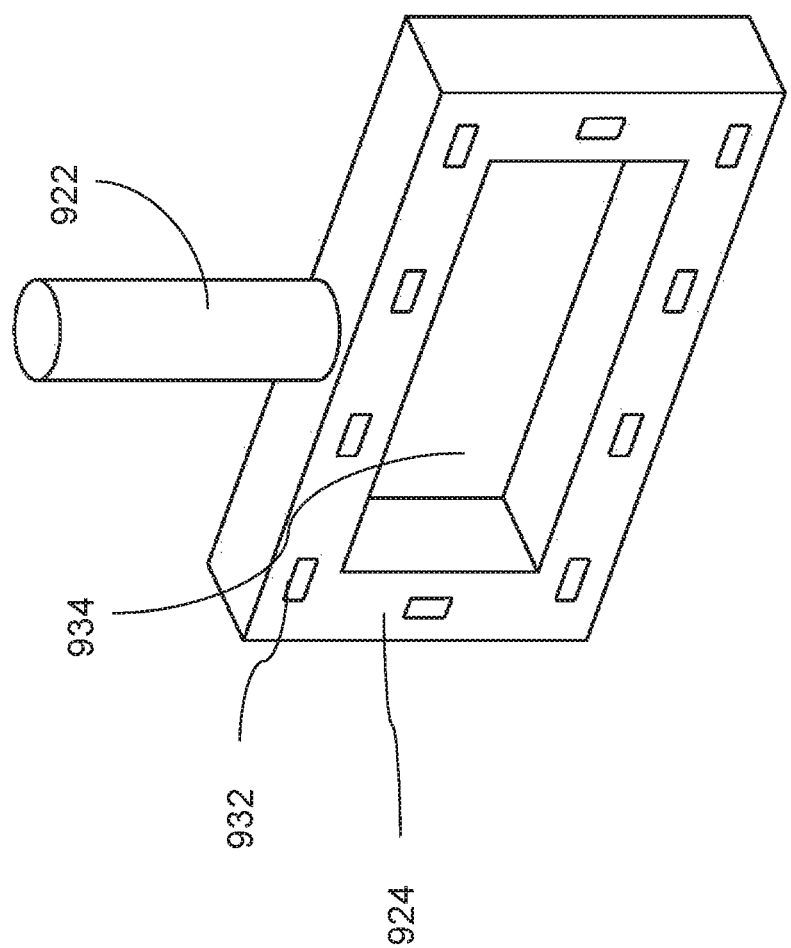
FIG. 9B is a cross-section view of an electrode spacer of a carrier cleaning system, according to embodiments disclosed herein.

Referring now to FIG. 9A-9B, an alternative embodiment of graphite chamber 918 is depicted. Graphite chamber 918 is configured for use with electrical resistance type heating such as that depicted in FIG. 8. In some embodiments, however, both electrical resistance type heating (e.g. FIG. 8) and radiofrequency type heating (e.g., FIG. 7) can be used. Graphite chamber 918 includes, at a first end, first electrode flange 920, first electrode 922, and a first spacer 924. In this embodiment, first electrode flange 920 is integral with graphite chamber 918 and is thus made of graphite. In alternative embodiments, first electrode flange 920 can be fixedly coupled to graphite chamber 918 and made of electrically conductive material capable of withstanding CVD manufacturing environments (e.g., molybdenum.) Similarly, first electrode 922 and first spacer 924 are made of electrically conductive material capable of withstanding CVD manufacturing environments (e.g., molybdenum, graphite, etc.) First electrode 922 is fixedly coupled to first spacer 924 and first spacer 924 is coupled to first electrode flange 920. First spacer 924 is coupled to first electrode flange 920 such that there is high electrical conductivity between these components.

Graphite chamber 918 also includes, at a second end, second electrode flange 926, second electrode 928, and a second spacer 930. In this embodiment, second electrode flange 926 is integral with graphite chamber 918 and is thus made of graphite. In alternative embodiments, second electrode flange 926 can be fixedly coupled to graphite chamber 918 and made of electrically conductive material capable of withstanding CVD manufacturing environments (e.g., molybdenum.) Similarly, second electrode 928 and second spacer 930 are made of electrically conductive material capable of withstanding CVD manufacturing environments (e.g., molybdenum, graphite, etc.) Second electrode 928 is fixedly coupled to second spacer 930 and second spacer 930 is coupled to second electrode flange 926. Second spacer 930 is coupled to second electrode flange 926 such that there is high electrical conductivity between these components.

When a higher temperature is desired within cleaning chamber 723, a voltage potential can be applied across first electrode 922 and second electrode 928 such that electrical current flows from first electrode 922 to first spacer 924 to first electrode flange 920 and then through graphite chamber 918 to second spacer 930 and then to second electrode 928. In this embodiment graphite chamber 918 is configured to operate as an electrically resistive heating element.

As depicted in FIG. 9B, first spacer 924 further includes a plurality of spacer fixation apertures 932 and a chamber aperture 934. Spacer fixation apertures 932 are sized and shaped to allow bolts or other fixation components to pass through them to aid in fixation of first spacer 924 to first electrode flange 920. Chamber aperture 934 is sized and shaped to peripherally surround graphite chamber 918. Note that FIG. 9B depicts first spacer 924 and first electrode 922, but because second spacer 930 and second electrode 928 can be identical to first spacer 924 and first electrode 922, FIG. 9B also depicts second spacer 930 and second electrode 928.

Figure 10:
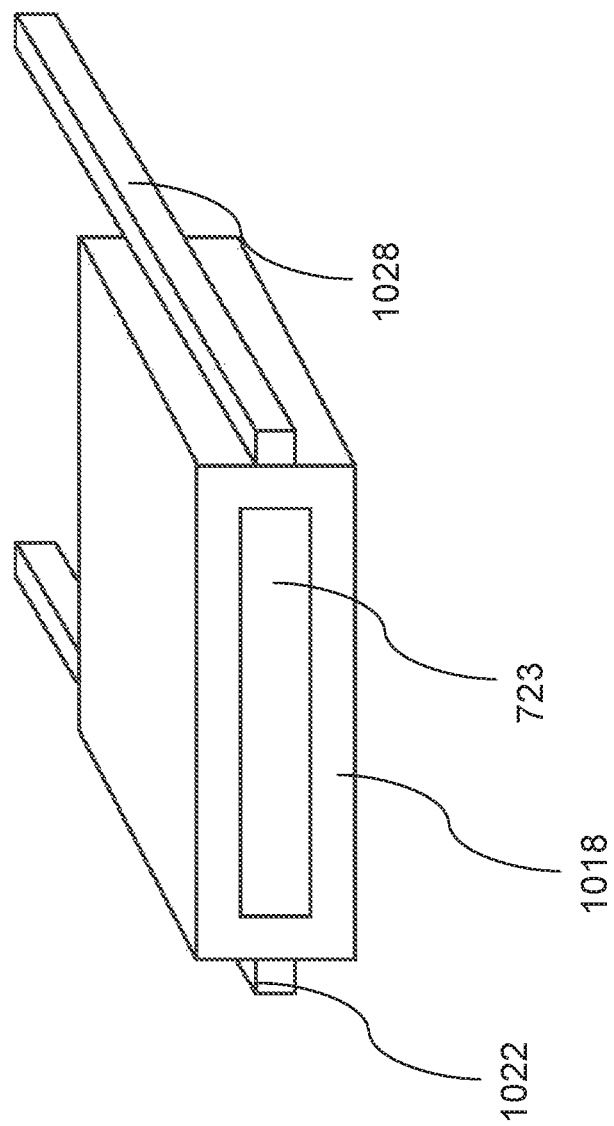
FIG. 10 is an isometric view of a graphite chamber of a carrier cleaning system, according to embodiments disclosed herein.

Referring now to FIG. 10, an alternative embodiment of graphite chamber 1018 is depicted. Graphite chamber 1018 is configured for use with electrical resistance type heating such as that depicted in FIG. 8. In some embodiments, however, both electrical resistance type heating (e.g. FIG. 8) and radiofrequency type heating (e.g., FIG. 7) can be used. Graphite chamber 1018 is configured to receive a first electrode 1022 and a second electrode 1028 along the length of graphite chamber 1018 at either sides of graphite chamber 1018. In this embodiment, electrical current is configured to flow across graphite chamber 1018 in a direction perpendicular to the electrical current flow in the embodiments depicted in FIGS. 8 and 9A-9B.

Figure 11:
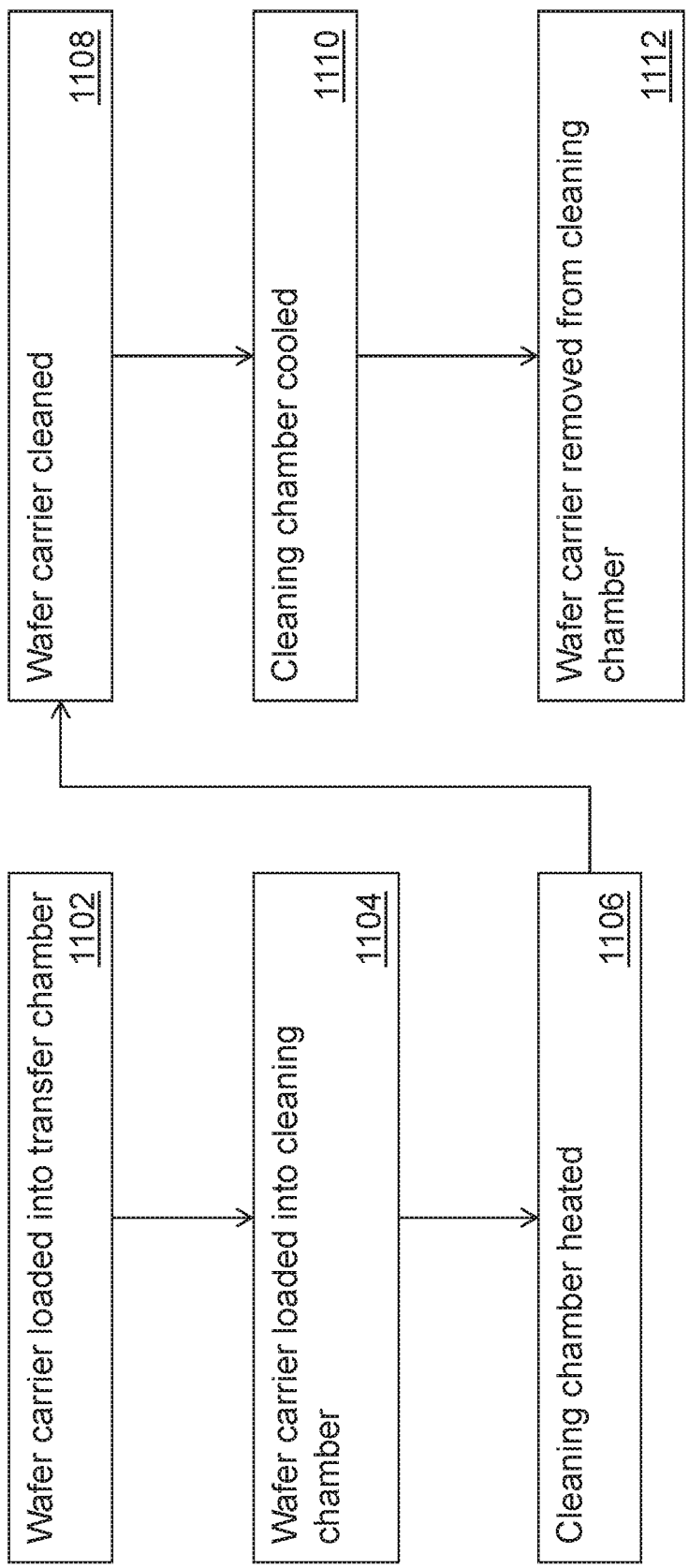
FIG. 11 is a flowchart for cleaning a wafer carrier in a carrier cleaning system, according to embodiments disclosed herein.

In use and as depicted in FIG. 11, wafer carriers are loaded into CCM transfer chamber 710 of cluster cleaning system 700 at Step 1102. In particular, wafer carriers can be loaded onto staging platform 712 of CCM transfer chamber 710. CCM transfer chamber 710 can depressurize and condition the wafer carrier during Step 1102 prior to entering processing cluster CCM 704 in order to maintain a consistent cleaning chamber environment. Once cleaning chamber 723 of processing cluster CCM 704 is prepared to receive a wafer carrier for cleaning, wafer carrier is loaded into cleaning chamber 723 at Step 1104. Further, step 1104 includes gate valve 706 opening and the wafer carrier being loaded into cleaning chamber 723. Step 1104 also includes gate valve 706 closing such that cleaning chamber 723 is enclosed and capable of containing a cleaning process.

Cleaning chamber 723 is then heated to the desired temperature for a cleaning process at Step 1106. During Step 1106, cleaning chamber 723 is heated via radio frequency heating coil 742, electrical resistance heating as depicted in FIGS. 8-10, or both. Also during Step 1106, radiant heat shield array 760 can be in the reflecting position such that the desired temperature is reached at a faster rate.

The wafer carrier is then cleaned at Step 1108. During Step 1108, the one or more cleaning reactant injectors 736 of injector module 732 begins to pump removal reactant into cleaning chamber 723. One or more cleaning reactant injectors 736 can be configured to pump removal reactants for removing group (III) nitride layers and carbon based compounds, such as $Cl_2$ and $N_2O$, respectively, into the cleaning environment for high temperature etching. Additionally, other reactants can also be used; nitrogen trifluoride ($NF_3$), tertrafluoromethane ($CF_4$), sulfur hexafluoride ($SF_6$), hexafluoroethane ($C_2F_6$), carbon tetrachloride ($CCl_4$), hexachloroethane ($C_2Cl_6$), and mixtures thereof, for example. During Step 1108, cleaning reactants are pumped into cleaning chamber 723 at the first end of cleaning chamber 723 continue to pass over and around wafer carrier platform 730 prior to exiting through exhaust aperture 728 of exhaust flange 726.

Also during Step 1108, the one or more purge injectors 738 of injector modules 732 rout inert purge gas, such as $N_2$, through chamber gap 740 and then through exhaust dilution apertures 720. Exhaust dilution apertures 720 then route the inert purge gas into exhaust block 724 where the inert purge gas mixes with the removal reactants from cleaning chamber 723 such that removal reactant gas mixture is diluted. The diluted removal reactant gas mixture is then routed through exhaust aperture 728 of exhaust flange 726. The diluted removal reactant gas mixture reduces etchant buildup in the areas of graphite chamber 718, exhaust block 724, and exhaust aperture 728 that are cooler than the heating portion of graphite chamber 718. Further, routing purge gas across the inner wall of quartz chamber 714 reducing etchant buildup. Reducing etchant buildup increases the average time between maintenance and cleaning of cluster cleaning system 700.

Once the cleaning process in complete and the wafer carrier is cleaned, cleaning chamber 723 is cooled at Step 1110. During Step 1110, coolant is pumped through the plurality of cooling channels 734 arranged throughout processing cluster CCM 704. Also during Step 1110, radiant heat shield array 760 can be positioned in the transmission position such that radiant energy can pass by radiant heat shield array 760 and emit into the environment. Allowing radiant energy to emit into the environment rather than reflect back into processing cluster CCM 704 decreases cooling time.

During or after cleaning chamber 723 cooling at Step 1110, the wafer carrier is removed from cleaning chamber 723 and placed onto staging platform 712 of CCM transfer chamber 710 at Step 1112. Further, Step 1112 includes gate valve 706 opening and the wafer carrier being removed cleaning chamber 723. Step 1112 also includes gate valve 706 optionally closing such that cleaning chamber 723 environmental conditions can be maintained.

The various embodiments of carrier cleaning modules described herein can also include one or more surface characterization tools. The surface characterization tools can be configured to examine and detect whether an unclean and unloaded wafer carrier has been properly cleaned in embodiments of the carrier cleaning modules. Further, the one or more surface characterization tools can detect presence of wafers in the wafer carrier. In this embodiment, the one or more surface characterization tools can detect than no wafers are present on the wafer carrier prior to a wafer carrier cleaning cycle. The one or more surface characterization tools can include pyrometers, surface emissivity monitors, thermal imaging devices, surface x-ray analyzers, ultrasonic sensors, optical measuring systems, photometric systems, photoluminescence spectroscopes, x-ray diffraction, eddy current measure, surface defect macro inspection, and other suitable non-destructive surface measurement tools.

The one or more surface characterization tools of embodiments of the carrier cleaning modules can be configured for analyzing clean quality, clean uniformity, and carrier integrity, among other clean process analyses. Embodiments of the carrier cleaning modules can be configured address failures of one or more of these analyses. For example, if a wafer carrier fails a carrier integrity test, the damaged wafer carrier can be removed from MOCVD processing system 100. If a wafer carrier fails a clean quality analysis because parasitic deposition remains on the wafer carrier, for example, the wafer carrier can be re-cleaned or removed. Similarly, if a wafer carrier fails a clean uniformity analysis because localized parasitic deposition remains on the wafer carrier the wafer carrier can be re-cleaned or removed.

Wafer Carrier Cleaning Quality Analysis

During the cleaning process, unwanted deposition material on the wafer carrier surface is removed. Removal of the unwanted deposition material changes the wafer carrier surface emissivity. In one embodiment, a clean quality analysis can be performed using direct emissivity measurements by way of high temperature emissometers. Clean quality analysis using direct emissivity measurements include performing surface emissivity measurements after a cleaning process. The post-cleaning surface emissivity measurements can be compared to reference surface emissivity measurements of bare wafer carrier material. In some embodiments, post-cleaning surface emissivity measurements can be compared to surface emissivity measurements considered "clean" but not necessarily bare wafer carrier material.

Figure 12A:
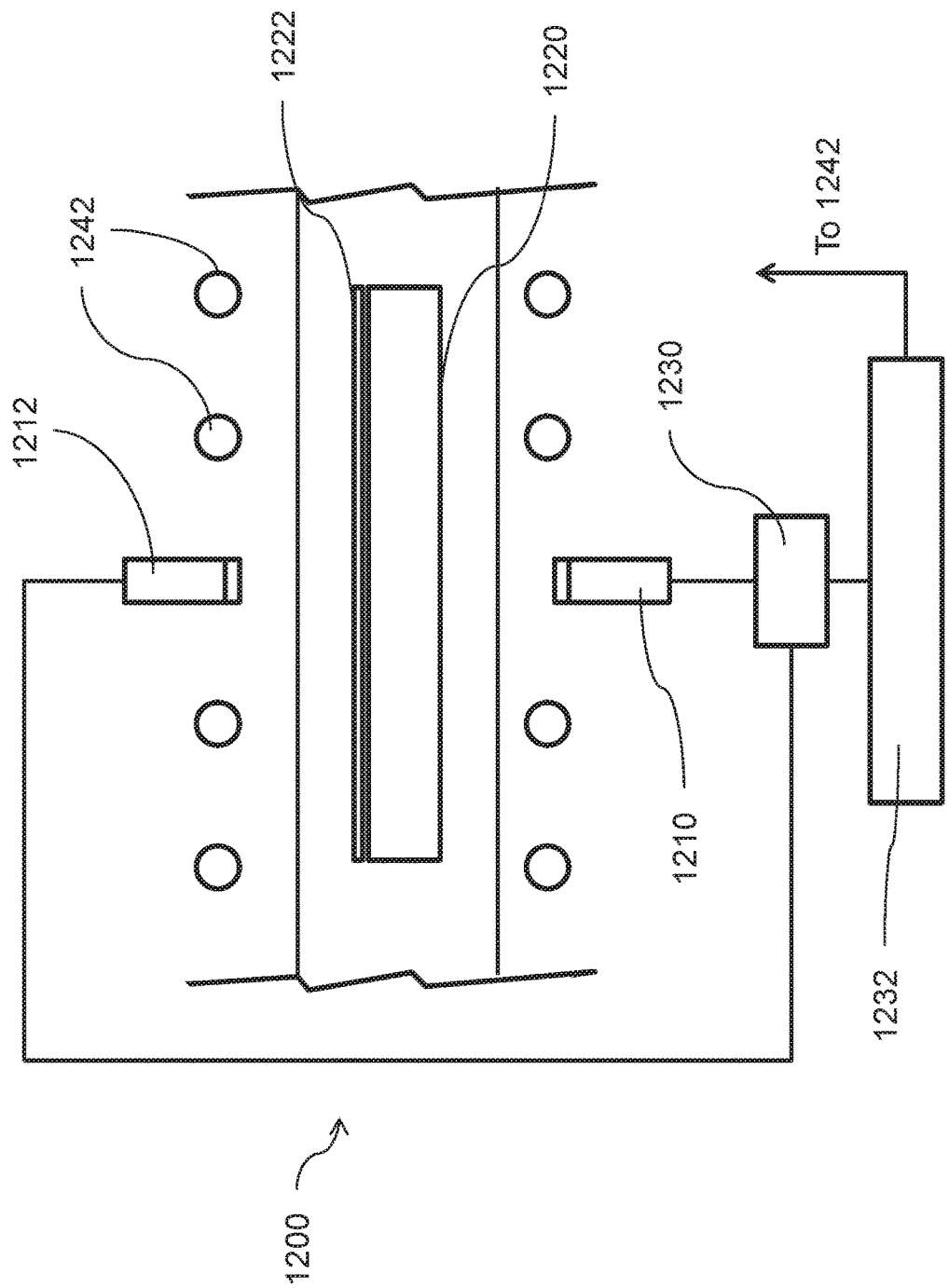
FIG. 12A is a cross-section view of portion of a wafer carrier cleaning module and a surface characterization system, according to embodiments disclosed herein.

In another embodiment of wafer carrier quality analysis, and as depicted in FIG. 12A, an embodiment of a surface quality analysis system 1200 can include a first pyrometer 1210 and a second pyrometer 1212. First pyrometer 1210 is arranged on a lower portion of an embodiment of a carrier cleaning chamber. First pyrometer 1210 is further positioned to point at a bottom surface 1220 of a wafer carrier. Bottom surface 1220 is an uncoated surface and therefore retains a relatively constant surface emissivity value throughout cleaning processes. Second pyrometer 1212 is arranged on an upper portion of an embodiment of a carrier cleaning chamber. Second pyrometer 1212 is further positioned to point at a top surface 1222 of a wafer carrier. Top surface 1222 is subject to all of the coating processes for semiconductor wafer production and therefore collects residual deposition on portions of top surface 1222. Therefore, the surface emissivity value of portions of top surface 1222 changes as the residual deposition is removed during cleaning processes.

Surface quality analysis system 1200 further includes a controller 1230, a power supply 1232, and a plurality of heating coils 1242. In embodiments, controller 1230 is coupled to first pyrometer 1210, second pyrometer 1212, and power supply 1232. Power supply 1212 is further coupled to the plurality of heating coils 1242. Upon instruction from controller 1230, power supply 1212 is configured to provide power to heating coils 1242 to raise the temperature of the cleaning chamber. In one embodiment, controller 1230 is configured to modulate heating coils 1242 through power source 1232 to maintain a constant temperature or to reach a desired temperature based on the temperature measurement of first pyrometer 1210.

Figure 12B:
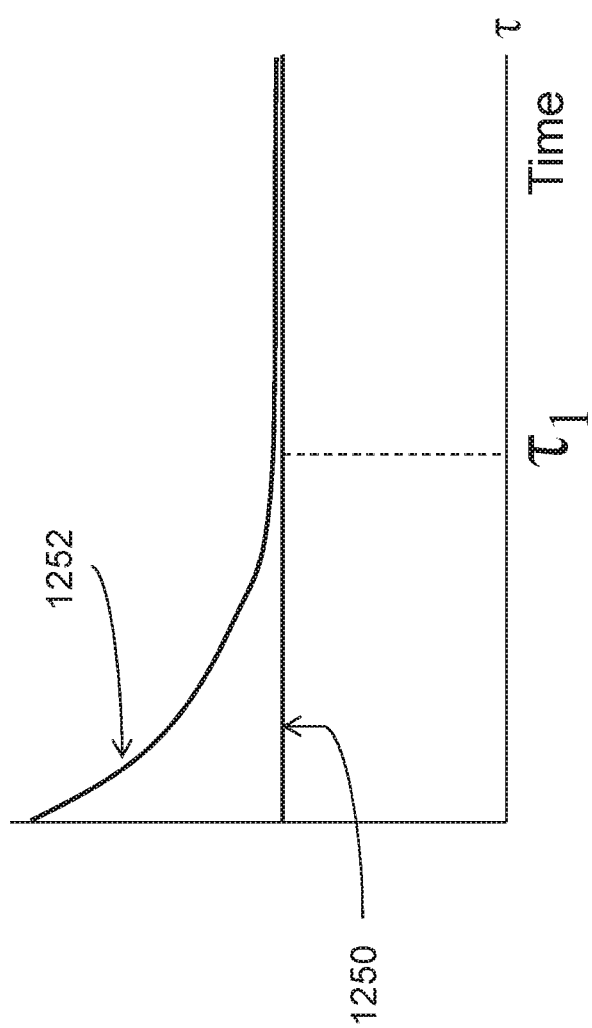
FIG. 12B is a graphical depiction of pyrometer readings over time of a surface characterization system, according to embodiments disclosed herein.

In use and as depicted in FIG. 12B, surface quality analysis system 1200 begins a cleaning quality analysis during or near the end of a cleaning process or after a cleaning process has completed. First, a baseline temperature 1250 of the wafer carrier is reached and maintained by controller 1230 based on the temperature reading of first pyrometer 1210. Because first pyrometer 1210 is pointed at uncoated wafer carrier bottom surface 1220, baseline temperature 1250, i.e. the first pyrometer 1210 reading, acts as a reference temperature. Controller 1230 then compares baseline temperature 1250 to a top surface temperature 1252. Top surface temperature 1252 is the temperature measurement taken by second pyrometer 1212. During a cleaning cycle, residual deposition is removed from top surface 1222 resulting in a changing surface emissivity. Therefore, top surface temperature 1252 changes relative to baseline temperature 1250 during removal of residual deposition. In the example depicted in FIG. 12B, top surface temperature 1250 declines during the cleaning process until a time $\tau_1$, at which time no residual deposition remains. Time $\tau_1$ represents the time at which the wafer carrier is considered clean by surface quality analysis system 1200.

In an alternative embodiment, surface quality analysis system 1200 determines clean quality based solely the stabilization of top surface temperature 1252. In this embodiment, controller 1230 instructs power source 1232 to supply a constant or consistent modulation of power to heating coils 1242 to produce a consistent wafer carrier temperature without reference to the temperature of bottom surface 1220 using first pyrometer 1210. In this embodiment, the wafer carrier temperature is assumed constant and therefore, fluctuations of top surface temperature 1252 indicate presence of residual deposition on top surface 1222. Once top surface temperature 1252 is stabilized, the wafer carrier is considered clean by surface quality analysis system 1200.

In an alternative embodiment, surface quality analysis can be conducted by X-ray analysis of a wafer carrier surface. In this embodiment, an X-ray fluorescence analysis device can be used to detect impurities on the surface of the wafer carrier. For example, the presence of deposition materials, such as In, Ga, and Al, indicate that the wafer carrier is not clean. The presence of only wafer carrier construction materials, such as C and Si, indicate that the wafer carrier is clean.

In yet another embodiment, exhaust gasses from the cleaning process can be analyzed for the presence of residual deposition materials. In this embodiment, an infrared spectroscope device can be used to identify byproducts of removal of residual deposition. The presence of byproducts of removal of residual deposition indicates that the wafer carrier is not clean and the absence of residual deposition cleaning byproducts indicates that the wafer carrier is clean.

Wafer Carrier Cleaning Uniformity Analysis

In one embodiment of wafer carrier cleaning uniformity analysis, direct surface emissivity mapping devices can be used to identify localized parasitic depositions on otherwise clean wafer carrier surfaces. For example, a scanning pyrometer can be used to map the top surface of the wafer carrier. The scanning pyrometer can measure the surface temperature at a plurality of points across the entire surface of the wafer carrier. Assuming a constant actual surface temperature, a thermal map created by the scanning pyrometer showing varied temperature readings indicates the presence of residual deposition. A clean wafer carrier, on the other hand, is indicated by a relatively uniform thermal map under constant actual surface temperature.

In an alternative embodiment, thermal imaging devices, such as a thermal imaging camera, can also be used to identify localized parasitic depositions on otherwise clean wafer carrier surfaces. In this embodiment, a thermal variance map can be captured using a thermal imaging device. Because temperatures captured using thermal imaging are highly dependent on surface emissivity, measured temperatures in an area where parasitic deposition is present will be different than the measured temperature of the neighboring bare wafer carrier material. Thus, a range in temperatures can be measured using the thermal variance map. Assuming the actual temperature range across the wafer carrier is very small, a temperature range measured via thermal imaging that is larger than a predetermined range indicates the presence of localized parasitic deposition. If a wafer carrier has a temperature range that is larger than the predetermined temperature range, the wafer carrier would fail the cleaning uniformity analysis and the wafer carrier would be removed or re-cleaned.

In an alternative embodiment, a scanning X-ray fluorescence analysis device can be used to map the top surface material composition. The X-ray fluorescence analysis can be mounted to a movable head above the wafer carrier such that an impurities distribution can be obtained at a plurality of points across the wafer carrier. The presence of deposition materials at any point across the surface of the wafer carrier indicates that the wafer carrier is not clean. The presence of only wafer carrier construction materials indicates that the wafer carrier is clean. Further, an image comparison system can be used to compare the surface impurities distribution map of a clean wafer carrier to the surface impurities distribution map of an unclean wafer carrier.

Wafer Carrier Integrity Analysis

In CVD wafer production systems, such as MOCVD processing system 100, wafer carriers have a distinct lifetime as they are exposed to extreme temperature changes and harsh chemicals. Wafer carrier degradation usually starts with the forming micro-cracks on the side surface of the wafer carrier. In embodiments wafer carrier integrity sensors can be implemented to monitor the side surfaces of the wafer carriers and identify integrity issues early in the life of the wafer carrier. Wafer carrier integrity sensors can include infrared imaging devices. An infrared imaging device can identify surface cracks due to cracks having a different effective emissivity. This is especially useful in the case of inductive heating when small surface cracks are affecting skin effect and clearly demonstrate crack area.

Other embodiments of wafer carrier integrity sensors may include ultrasonic sensors and X-rays. For example, ultrasonic crack detection devices can be directed at the side surface of the wafer carrier to indicate internal or surface cracks based on the ultrasonic reflection of the side surface. X-ray visual imaging can also be directed to the side surface to visually reveal cracks within or on the side surface of the wafer carrier.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

For purposes of interpreting the claims, it is expressly intended that the provisions of 35 U.S.C. § 112(f) are not to be invoked unless the specific terms "means for" or "step for" are recited in a claim.

The invention claimed is:

1. A chemical vapor deposition system for semiconductor wafer production, the system comprising:
    a transfer chamber having a first end and a second end;
    an automatic factory interface including an automatic factory interface robot and operably coupled to the first end of the transfer chamber, the automatic factory interface robot configured to load and unload one or more wafers from one or more wafer carriers;
    one or more wafer carrier cleaning modules directly coupled to the automatic factory interface, the one or more wafer cleaning modules configured to automatically clean the one or more of the wafer carriers, the one or more wafer carrier cleaning modules further including:
        one or more surface characterization tools to detect one or more surface characteristics of the one or more wafer carriers; and
        one or more storage areas for the one or more wafer carriers, wherein the one or more storage areas comprise: a first storage area for damaged wafer carriers, a second storage area for wafer carriers that are ready to be cleaned, a third storage area for cleaned wafer carriers after they have been cleaned in the one or more wafer carrier cleaning modules, and a fourth storage area that contains replacement wafer carriers that can be used to replace the damaged wafer carriers that are stored in the first storage area; and
    a process cluster operably coupled to the second end of the transfer chamber, the process cluster comprising one or more processing modules;
    wherein the one or more wafer carrier cleaning modules further include a wafer carrier cleaning robot;
wherein the first and second storage areas are located on one side of the wafer carrier cleaning robot and the third and fourth storage areas are located on another side of the wafer carrier cleaning robot.

2. The chemical vapor deposition system of claim 1, wherein the process cluster includes a process cluster robot configured to manipulate the one or more wafer carriers into and out of the transfer chamber.

3. The chemical vapor deposition system of claim 1, wherein the one or more wafer carrier cleaning modules comprises two or more wafer carrier cleaning modules.

4. The chemical vapor deposition system of claim 1, wherein the automatic factory interface robot is configured to manipulate the one or more wafer carriers directly into and out of the one or more wafer carrier cleaning modules.

5. The chemical vapor deposition system of claim 1, wherein one or more of the storage areas of the one or more storage areas further includes a cooling station.

6. The chemical vapor deposition system of claim 1, wherein the one or more surface characterization tools detect whether the one or more wafer carriers are damaged wafer carriers for placement in the first storage area of acceptable wafer carriers for placement in the second storage area.

7. The chemical vapor deposition system of claim 1, further including one or more front opening universal pods along a front edge of the automatic factory interface.

8. The chemical vapor deposition system of claim 1, wherein at least one of the one or more wafer carrier cleaning modules includes:
    one or more injector modules for injecting one or more cleaning gases into the one or more wafer carrier cleaning modules; and an exhaust aperture for routing the cleaning gases out of the one or more wafer carrier cleaning modules.

9. The chemical vapor deposition system of claim 8, wherein the one or more injector modules each includes a cooling channel and the at least one wafer carrier cleaning module includes a heater that comprises an array of radio frequency heating coils.

10. The chemical vapor deposition system of claim 1, further including:
one or more purge injectors for injecting an inert purge gas into the one or more wafer carrier cleaning modules;
exhaust dilution apertures that are configured for routing the gases out of the one or more wafer carrier cleaning modules.

11. The chemical vapor deposition system of claim 1, wherein the one or more surface characterization tools is selected from a group consisting of: pyrometers, surface emissivity monitors, thermal imaging devices, surface x-ray analyzers, ultrasonic sensors, optical measuring systems, photometric systems, photoluminescence spectroscopes, x-ray diffraction devices, eddy current measurement tools, and surface defectivity macro inspection tools.

12. The chemical vapor deposition system of claim 1, wherein the one or more surface characterization tools are configured to detect cracks in the one or more wafer carriers, and in the event that one or more wafer carriers include detected cracks, the one or more cracked wafer carriers are delivered to the first storage area.

* * * * *